US009482712B2

(12) United States Patent
Woodward, Jr. et al.

(10) Patent No.: US 9,482,712 B2
(45) Date of Patent: Nov. 1, 2016

(54) METHOD AND APPARATUS FOR TESTING UTILITY POWER DEVICES

(71) Applicant: Doble Engineering Company, Watertown, MA (US)

(72) Inventors: Robert Clark Woodward, Jr., Cambridge, MA (US); George Matthew Kennedy, Roseville, CA (US)

(73) Assignee: DOBLE ENGINEERING COMPANY, Watertown, MA (US)

( * ) Notice: Subject to any disclaimer, the term of this patent is extended or adjusted under 35 U.S.C. 154(b) by 410 days.

(21) Appl. No.: 14/071,207

(22) Filed: Nov. 4, 2013

(65) Prior Publication Data

US 2014/0125351 A1    May 8, 2014

Related U.S. Application Data

(60) Provisional application No. 61/722,547, filed on Nov. 5, 2012.

(51) Int. Cl.
 *G01R 31/02* (2006.01)
 *G01R 31/327* (2006.01)
 (Continued)

(52) U.S. Cl.
 CPC ......... *G01R 31/027* (2013.01); *G01R 31/3272* (2013.01); *G01R 27/2694* (2013.01); *G01R 31/14* (2013.01)

(58) Field of Classification Search
 CPC ...... G01R 31/25; G01R 31/12; G01R 31/08; G01R 1/025; G01R 31/27; G01R 31/2834; G01R 31/362; G01R 31/3624; G01R 31/3637; H02H 7/04; H02H 3/52; H02H 3/162; H02H 3/331; H02H 3/338; H02H 9/08; G05F 1/45; G05F 1/147; G06F 1/26; G06F 1/266; G06F 1/3203; G06F 1/3296; H01M 10/42; H01M 10/48
 See application file for complete search history.

(56) References Cited

U.S. PATENT DOCUMENTS 4,241,306 A   12/1980   Bump
5,396,172 A    3/1995   Lat
(Continued)

FOREIGN PATENT DOCUMENTS

GB   2192464 A    1/1988
GB   2411733 A    9/2005
WO   0235248 A1   5/2002

OTHER PUBLICATIONS

International Preliminary Report on Patentability for PCT:US2013:068273, completed Sep. 28, 2014.
(Continued)

*Primary Examiner* — Minh N Tang
(74) *Attorney, Agent, or Firm* — Brinks Gilson & Lione

(57) ABSTRACT

An apparatus for performing measurements on a utility power device that shares a common ground with the apparatus selectively sends a first high voltage signal via a first lead to a first terminal of the utility power device, measures a first corresponding signal returned via a second lead of the apparatus from a second terminal of the utility power device. While the corresponding first lead and the second lead of the apparatus remain electrically coupled to the corresponding first and the second terminal of the utility power device. The apparatus selectively sends a second high voltage signal via the second lead to the second terminal of the utility power device, and measures a second corresponding signal returned via the first lead of the apparatus from the first terminal of the utility power device.

22 Claims, 13 Drawing Sheets

(51) Int. Cl.
*G01R 27/26* (2006.01)
*G01R 31/14* (2006.01)

(56) References Cited

U.S. PATENT DOCUMENTS

| | | |
|---|---|---|
| 5,455,506 A | 10/1995 | Mimeault |
| 6,445,196 B1 | 9/2002 | White |
| 7,026,822 B1 | 4/2006 | Bald |
| 7,565,253 B2 | 7/2009 | Ewers |
| 8,466,690 B2 * | 6/2013 | Stewart .................. 324/551 |
| 2004/0124860 A1 | 7/2004 | Hamdan |
| 2010/0026312 A1 | 2/2010 | Buxkemper |
| 2012/0019962 A1 | 1/2012 | Faxvog |
| 2012/0139555 A1 | 6/2012 | Mayfield |

OTHER PUBLICATIONS

Doble Engineering Company, "Doble Test Procedures", Copyright 2000.

IEEE Std C57.12.90, "IEEE Standard Test Code for Liquid Immersed Distribution, Power, and Regulating Transmformers", Oct. 15, 2010.

Written Opinion for PCT:US2013:068273, completed Mar. 4, 2014.
International Search Report for PCT:US2013:068273, mailed Mar. 28, 2014.

Supplementary European Search Report received in Application No. 13851883.2-1568/2914969 dated Jun. 6, 2016.

* cited by examiner

METHOD AND APPARATUS FOR TESTING UTILITY POWER DEVICES

RELATED APPLICATIONS

This application claims the benefit of priority to U.S. Provisional Application No. 61/722,547, filed Nov. 5, 2012, the contents of which are hereby incorporated by reference in their entirety.

FIELD OF THE TECHNOLOGY

The present application relates to test equipment. More specifically, the present application relates to a method and apparatus for testing utility power devices.

INCORPORATION BY REFERENCE

To assist the reader understanding of the scope of the technology and testing procedures, the "Doble Test Procedures" (Doble Engineering Company's Publication Number 500-0397, document 72A-2244 Rev A) and the IEEE Standard Test Code for Liquid-immersed Distribution, Power and Regulating Transformers (IEEE Std C57.12.90-2010), are incorporated by reference in its entirety as part of the disclosure.

BACKGROUND

Utility power devices, such as circuit breakers, oil filled power and distribution transformers, transformer bushings, substation transformers, oil filled voltage regulators, vacuum breakers and reclosers, coupling capacitors, surge arresters, to name a few, operate in high voltages, which are upward of 10 kV and sometimes more than 69 kV. These utility power devices are frequently installed together with other high voltage devices having exposed terminals. Many of these utility power devices may be installed in an outdoor environment, on an elevated platform surrounded by high voltage transmission line cables, or these utility power devices may be obstructed by tree branches or by other utility power devices. Therefore, the ease or their access by the field workers is greatly limited.

In addition, performing routine maintenance checks or fault diagnostics may require testing the utility power devices in both low voltages (under 500V) and high voltages (>500V, typically 1 kV to 15 kV), which may require multiple connecting, disconnecting or reconnecting of both high voltage cables and low voltage cables to the different terminals of the utility power devices. As mentioned above, these utility power devices may be installed in an environment that is hard to access. It is also difficult for the worker to carry the heavy test apparatus to within reach of the utility power devices to conduct the test routines.

For example, FIG. 1A depicts the performance of an exemplary test measurement on a utility power device (150) in a related art method, using a low voltage lead (124) and a high voltage lead (134). The illustrated utility power device (150) may be an oil filled three-phase power transformer.

The utility power device (150) may include two sets of voltage windings, namely, high voltage windings (156) (Delta-connected transformer windings) and low voltage windings (166) (Wye-connected transformer windings). The high voltage windings (156) receive or output a higher voltage than the low voltage windings (166).

The high voltage windings (156) are wound on three nodes (H1A, H2A and H3A) with each of the three nodes (H1A, H2A and H3A) being 120 degrees out of phase from each other. Likewise, the low voltage windings (166) are wound on three nodes (X1A, X2A and X3A) with each of the three nodes (X1A, X2A and X3A) being 120 degrees out of phase from each other. In addition, the low voltage windings (166) include a neutral node X0A. The currents of the nodes H1A, H2A and H3A on the high voltage windings (156) may return via respective nodes X1A, X2A and X3A of the low voltage windings (166). The operating principle and manner of construction of a three-phase power transformer are generally known in the art.

Each of the nodes (H1A, H2A and H3A) in the high voltage windings (156) may be electrically coupled to respective high voltage bushings (H1, H2 and H3) as external terminals. Likewise, each of the nodes (X0A, X1A, X2A and X3A) in the low voltage windings (166) may be electrically coupled to respective low voltage bushings (X0, X1, X2 and X3) as external terminals. Each bushing is constructed to include a center conductor (e.g., 171) overlayed with with multilayer dielectric insulating materials, thus forming a capacitive bushing (e.g., H1). The bushings are rated for high voltage operations (>69 kV), and may be hermetically sealed to protect the center conductor and the multilayer insulating dielectric materials from exposure to the ambient atmosphere, which may cause degradation and shortening of their service life. Water shed discs (178) are formed on the bushing to help divert rain, snow or to help dissipate heat.

In addition, a tap electrode (e.g., Tp1, Tp2 or Tp3) is located at the base of the bushing (H1, H2 or H3) to provide electrical contact for evaluation of the integrity of the multilayer insulating dielectric materials within the bushing. The tap electrode (e.g., Tp1, Tp2 or Tp3) is normally covered, and the cover may be grounded to the chassis of the utility power device (150). The grounded cover may be removed to expose the tap electrode (Tp1, Tp2 or Tp3) to facilitate electrical contact with the tap electrode at the time of testing. More details about the electrical model of the bushing and the testing may be found in chapter three of the "Doble Test Procedures", which is incorporated by reference.

An exemplary apparatus (100) for performing multiple test measurements on the utility power device (150) is illustrated in FIG. 1A. The exemplary apparatus (100) includes a processor (112), which executes instruction code stored in at least one memory (113). The processor (150) may also execute an application (117) stored in the memory (113) to carry out the test routines on the utility power device (150). The processor (112) may also configure a switching matrix (118) to perform operations such as the sourcing of low voltage signals (e.g., <500V, typically up to 250V) via anyone of ports LVS1 (122a) to LVSn (122n), and the sourcing of high voltage signals (e.g., >500V, typically 1 kV to 15 kV) via port HV (132).

Return signals from high voltage excitation or low voltage excitation test measurements may be received via a low voltage lead (124) to anyone of the low voltage measurement ports LVM1 (123a) to LVM 3 (123c). In addition, a ground lead (126) from the TEST-GND port (121) of the apparatus (100) may be electrically coupled to the chassis ground (168) of the utility power device (150) to measure return ground currents of the utility power device (150).

Depending on the type of test measurement, currents measured from the low voltage lead (124) and from the ground lead (126) may be summed together by the apparatus (100). In certain test measurements, the TEST-GND port (121) or one of the low voltage measurement ports LVM1 (123a) to LVM 3 (123c) may be selectively routed internally by the switching matrix (118) to a guard point (128) within the apparatus as a by-pass current return path (i.e., the by-pass currents will not be measured). The guard point (128) signifies one or more conducting elements as return nodes internally connected on the apparatus (100), which may be used by the measurement unit (115) to divert (i.e., by-pass) unwanted currents from the measurements.

FIG. 1A also illustrates an exemplary test setup for conducting test measurements on the utility power device (150), such as a power factor (PF) test in the related art. The power-factor test measurement is specified in section 10.10.4 of the IEEE Std C57.12.90-2010. Power factor test measurements performed on the utility power device (150) at the factory are compared with power factor test measurements performed at the field to assess a probable condition of the internal insulation within the utility power device (150).

The setup in FIG. 1A may also short circuit the windings in both the high voltage windings (156) and the low voltage windings (166) to eliminate winding inductance when measuring internal insulation of the utility power device (150). The short circuiting may be achieved by using a conductive bus wire (174) to short circuit the conductors 171, 172 and 173) of the high voltage bushings (H1, H2 and H3), and using a conductive bus wire (184) to short circuit the conductors 180, 181, 182 and 183) of the low voltage bushings (X0, X1, X2 and X3), respectively.

Unless otherwise stated, it is understood that prior to the start of any test measurements in this disclosure, the apparatus (100) and the utility power device (150) are both electrically grounded to a common ground (i.e., an earth ground by default).

Section 10.10.4 of the IEEE Std C57.12.90-2010A specifies a typical power factor test on an oil filled two winding transformer, such as the utility power device (150) illustrated in FIG. 1A. Using the related art method, the complete power factor test may be carried out via a first procedure (see FIG. 1A) and a second procedure (see FIG. 1B). The order in which the two procedures are performed is unimportant. The first procedure may be performed on the high voltage winding side (156), and the second procedure may be performed on the low voltage winding side (166).

The first procedure may be carried out with the following exemplary steps:

(1) Placing the high voltage lead (134) on the bus wire (174) of the high voltage windings (156) (i.e., to all three terminals on the Delta-connected transformer windings), placing the low voltage lead (124) on the bus wire (184) of the low voltage windings (166) (to all three terminals on the Wye-connected transformer windings), and electrically coupling the TEST-GND port (121) of the apparatus (100) to the chassis ground (168) of the utility power device (150) via the ground lead (126).

(a) Configuring the switching matrix (118) to connect the low voltage lead (124) to TEST-GND port (121) (i.e., by routing the low voltage measure port LVM1 (123a) to the TEST-GND port (121)).
  (b) Configuring measurement unit (115) to measure current to the TEST-GND port (121) (i.e., measuring electrical parameters on both the current from the ground lead (126) and the low voltage lead (124) via port LVM1 (123a)).
  (c) Sending or applying a high voltage signal (HV) from the high voltage port HV (132) via the high voltage lead (134) to the bus wire (174) of the high voltage windings (156). Measuring the applied high voltage signal (HV), and the current in the measurement unit (115) (i.e., measuring electrical parameters on both the current from the ground lead (126) and the low voltage lead (124)).

(2) Continue with the same leads (124, 134, 126) arrangement for the set up configuration as in FIG. 1A:
  (a) Configuring switching matrix (118) to connect the low voltage lead (124) to GUARD point (128) (i.e., by internally routing the low voltage measure port LVM1 (123a) to the GUARD point (128) to by-pass the current in the low voltage lead (124)).
  (b) Configuring measurement unit (115) to measure current to TEST-GND port (121).
  (c) Sending or applying a high voltage signal (HV) from the high voltage port HV (132) via the high voltage lead (134) to the bus wire (174) of the high voltage windings (156). Measuring electrical parameters on the applied voltage (HV), and the current in the measurement unit (115) (i.e., measuring electrical parameters on only the current from the ground lead (126).

(3) Continue with the same leads (124, 134, 126) arrangement for the set up configuration in FIG. 1A:
  (a) Configuring switching matrix (118) to connect TEST-GND port (121) to GUARD point (128) (i.e., by routing the TEST-GND port (121) to the GUARD point (128) to by-pass the current in the ground lead (126)).
  (b) Configuring measurement unit (115) to measure current to the low voltage lead (124).
  (c) Measuring applied voltage (HV), and the current in the measurement unit (115) (i.e., measuring electrical parameters on only the current from the low voltage lead (124)).

The second procedure of the power factor test on the low voltage winding side may be carried out by repeating the identical steps (1) to (3) in the first procedure, using a setup configuration as illustrated in FIG. 1B. The configuration between the setup in FIG. 1A and FIG. 1B are different in that a) the high voltage lead (134) is now connected to the bus wire (184) of the low voltage windings (166), and b) the low voltage lead (124) is now connected to the the bus wire (174) of the high voltage windings (156). In other words, a high voltage signal (HV) may be applied from the high voltage port HV (132) via the high voltage lead (134) to the bus wire (184) of the low voltage windings (166), and measurements of electrical parameters may be taken via the low voltage lead (124) on the bus wire (174) of the high voltage windings (156).

It should be noted that the test setup configuration according to both FIGS. 1A and 1B would require the field worker to stop at the completion of steps (1) to (3) to regain access to the utility power device (150) to reverse the high voltage lead (134) and the low voltage lead (124) on the respective bus wires (174, 184). In this regard, the testing time may be lengthened, and the field worker may be exposed to the hazardous high voltage surroundings while attempting to regain access.

The problems above are exacerbated with the test measurements illustrated in FIGS. 1C and 1D. Similar to FIGS. 1A and 1B, the test measurements of FIGS. 10 and 1D may be power factor tests or insulation condition tests on the high voltage bushings (H1 to H3) and on the low voltage bushings (X1 to X3). The test measurements of FIGS. 1C and 1D may be viewed as two separate procedures of a complete test routine. More specifically, FIG. 1C represents a test setup configuration in a related art method, using a low voltage lead and a high voltage lead to measure the power factor of each of the high voltage bushings (H1, H2 and H3) and the low voltage bushings (X1, X2 and X3) on the utility power device (150).

The setup configuration in FIG. 1C may be similar to FIG. 1A in many aspects, including: short circuiting of both the high voltage windings (156) and the low voltage windings (166) to eliminate winding inductance when measuring internal insulation of the high voltage bushings (H1, H2 and H3) and the low voltage bushings (X1, X2 and X3), using the conductive bus wires (174 and 184) for the high voltage bushings (H1, H2 and H3) and the low voltage bushings (X0, X1, X2 and X3), respectively. Prior to the start of the test measurements, the apparatus (100) and the utility power device (150) are both electrically grounded to a common ground (i.e., an earth ground by default).

A typical power factor test performed on the high voltage bushing (H1, H2 and H3) in the related art may be carried out as with the following steps:

(1) Placing the high voltage lead (134) on the bus wire (174) of the high voltage windings (156) (i.e., to all three terminals on the Delta-connected transformer windings), connecting the low voltage lead (124) to the tap electrode (Tp1) of bushing H1, and electrically coupling the TEST-GND port (121) of the apparatus (100) to the chassis ground (168) of the utility power device (150) via the ground lead (126).
  (a) Configuring switching matrix (118) to connect TEST-GND port (121) to GUARD point (128) (i.e., by internally routing the TEST-GND port (121) to the GUARD point (128) to by-pass the current in the ground lead (126)).
  (b) Configuring measurement unit (115) to measure current to the low voltage lead (124).
  (c) Measuring applied voltage (HV), and the current in the measurement unit (115) (i.e., measuring only the current returned from the low voltage lead (124)).

(2) Continue with the same leads (134, 126) arrangement for the set up configuration as in FIG. 1C, except connecting the the low voltage lead (124) to the tap electrode (Tp2), and repeat the same tests (1a-1c) for the bushing (H2).

(3) Continue with the same leads (134, 126) arrangement for the set up configuration as in FIG. 1C, except connecting the low voltage lead (124) to the tap electrode (Tp3), and repeat the same tests (1a-1c) for the bushing (H3).

(4) Placing the low voltage lead (124) on the bus wire (174) of the high voltage windings (156) (i.e., to all three terminals on the Delta-connected transformer windings), connecting the high voltage lead (134) to the tap electrode (Tp1) of bushing H1, and electrically coupling the TEST-GND port (121) of the apparatus (100) to the chassis ground (168) of the utility power device (150) via the ground lead (126).
  (a) Configuring switching matrix (118) to connect the low voltage lead (124) to GUARD point (128) (i.e., by internally routing the low voltage lead port (LVM1) (123a) to the GUARD point (128) to by-pass the current in the low voltage lead (124)).
  (b) Configuring measurement unit (115) to measure current to the TEST-GND port (121).
  (c) Measuring applied voltage (HV), and the current in the measurement unit (115) (i.e., measuring only the current returned from the ground lead (126)).

(5) Continue with the same leads (124, 126) arrangement for the set up configuration as in FIG. 1C, except connecting the the high voltage lead (134) to the tap electrode (Tp2), and repeat the same tests (4a-4c) for the bushing (H2).

(6) Continue with the same leads (124, 126) arrangement for the set up configuration as in FIG. 1C, except connecting the low voltage lead (134) to the tap electrode (Tp3), and repeat the same test tests (4a-4c) for the bushing (H3).

It should noted that carrying out steps (1) to (3) requires changing the low voltage lead (124) to the subsequent tap electrode twice. Likewise, carrying out steps (4) to (6) also requires changing the high voltage lead (134) to the subsequent tap electrode twice. Swapping of the various leads (i.e., high voltage lead (134) with the low voltage lead (124) in step (4)) results in at least five interruptions for field worker. That is, the field worker would be exposed to a hazardous high voltage surrounding at least five times.

FIG. 1D depicts the same power factor test measurements on the low voltage bushings (X1 to X3) of the low voltage windings (166) using a similar test setup configuration as in FIG. 1C, except that the high voltage lead (134) is now connected to the bus wire (184) of the low voltage windings (166), and the low voltage lead (124) is now connected to the tap electrode (Tp4) of bushing X1. Accordingly, the second testing procedure of steps (1) to (6) are applicable to the test measurements. That is, there would be at least five interruptions during which the field worker would be exposed to a hazardous high voltage surrounding. Therefore, the field worker is exposed to interruptions and dangerous conditions a total number of ten times in the above test.

The voltage signal sent to the electrode taps (Tp1-Tp6) in carrying out steps (4) to (6) may be carried out at a lower voltage (e.g., 250V). In this regard, the high voltage port (132) may source a lower voltage (e.g., 250V). Alternately, steps (4) to (6) may be carried out using an second low voltage lead sourced by a low voltage port LVS1 (122a) that energizes electrode taps (Tp1-Tp6).

Nevertheless, irrespective of whether the steps (4) to (6) in FIG. 1C or 1D are carried out using the same high voltage lead (134), or alternately using a second low voltage lead sourced by a low voltage port LVS1 (122a) (not shown), the field worker still needs to stop at least ten times to complete both test procedure using the test set up configuration as in FIGS. 1C and 1D.

To summarize the problems in the related art method, testing of the utility power device using the related art methods requires more frequent changing of the voltage leads and, therefore, more frequent interruptions to the workflow. Thus, the known methods take a relatively long time to complete. They are also more prone to human error given that worker fatigue may be an issue, especially when the working environment is not well lit, which would be the case at night during a power outage. In addition, the more frequent accessing of the utility power device to change voltage leads results in an increased risks to the worker of injuries or even accidental death resulting from electrocution.

SUMMARY

The disclosure addresses improving personnel safety and simplifying testing routines through minimizing cable handling. More specifically, the disclosure illustrates various test method embodiments and functions performed by a testing apparatus to achieve reduction in the frequency of connecting, disconnecting or reconnecting of both high voltage leads and low voltage leads to the various terminals of the utility power devices, thereby improving personnel safety in a hazardous work environment, and reducing test time.

The application discloses various embodiments of a method for performing multiple test measurements on a utility power device by providing an apparatus having at least a processor, a common high voltage source, and at least a first and a second lead selectively coupled to the common high voltage source for sending and receiving high voltage signals. The apparatus and the utility power device share a common ground. The method includes selectively sending a first high voltage signal via the first lead of the apparatus to a first terminal of the utility power device; and measuring respective electrical parameters of a first corresponding signal returned via the second lead of the apparatus from a second terminal of the electrical utility power device.

While the corresponding first lead and the second lead of the apparatus remain electrically coupled to the corresponding first and the second terminal of the utility power device, the method includes selectively sending a second high voltage signal via the second lead of the apparatus to the second terminal of the electrical utility power device, and measuring respective electrical parameters of a second corresponding signal returned via the first lead of the apparatus from the first terminal of the utility power device.

In a second embodiment an apparatus for performing multiple test measurements on a utility power device, and that shares a common ground with an electrical utility power device, includes a processor, a common high voltage source, and at least a first and a second lead coupled to the common high voltage source for sending and receiving high voltage signals. The processor controls the apparatus to selectively send a first high voltage signal via the first lead of the apparatus to a first terminal of the utility power device, and measure respective electrical parameters on a first corresponding return signal received via the second lead of the apparatus from a second terminal of the utility power device.

While the corresponding first lead and the second lead of the apparatus remain electrically coupled to the corresponding first and the second terminal of the electrical utility power device, the processor controls the apparatus to selectively send a second high voltage signal via the second lead of the apparatus to the second terminal of the utility power device, and measure respective electrical parameters on a second corresponding return signal received via the first lead of the apparatus from the first terminal of the utility power device.

In the various embodiments, selective sending of the first high voltage signal and the second high voltage signal and the measuring of the respective electrical parameters corresponding to the first and the second return signals, includes internally switching a corresponding first and second switching network. Each switching network has a plurality of high voltage relays and at least one switch to facilitate the selective switching.

In another embodiment, both the first lead and the second lead may be coupled to the common voltage source, and a high voltage signal may be simultaneously sent via the first lead and the second lead of the apparatus to a first and a second terminal of the utility power device. The corresponding first and the second return signals are measured via at least one low voltage lead coupled between the apparatus and the utility power device.

The apparatus for performing test measurements on various utility power devices and the method for using the apparatus are merely exemplary. Other electrical devices not classified within the utility power device category may be tested with the apparatus. In addition or alternatively, the apparatus may be adapted to test other electrical devices. Such adapted apparatus are understood to fall within the scope of the claims. In addition, the disclosed methods may be implemented in many different permutations and the test measurements may be performed in other sequences according to the knowledge of those who possesses ordinary skills in the art.

BRIEF DESCRIPTION OF THE DRAWINGS

The accompanying drawings are included to provide a further understanding of the claims, are incorporated in, and constitute a part of this specification. The detailed description and illustrated embodiments described serve to explain the principles defined by the claims.

DETAILED DESCRIPTION OF THE EMBODIMENTS

Described below is a test apparatus that overcomes the problems inherent with known utility power device test equipment and the procedures for using the same. Generally, the test apparatus has a number of ports that are coupled to a utility power device. Depending on a test to be performed, the test apparatus automatically reconfigures the ports to be either inputs or outputs. The test apparatus also outputs various voltages to those ports configured as outputs and measures signals received from those ports configured as inputs. This automatic reconfiguring of the ports frees the operator from having to switch leads back and forth, which is required with known test equipment.

Figure 1A:
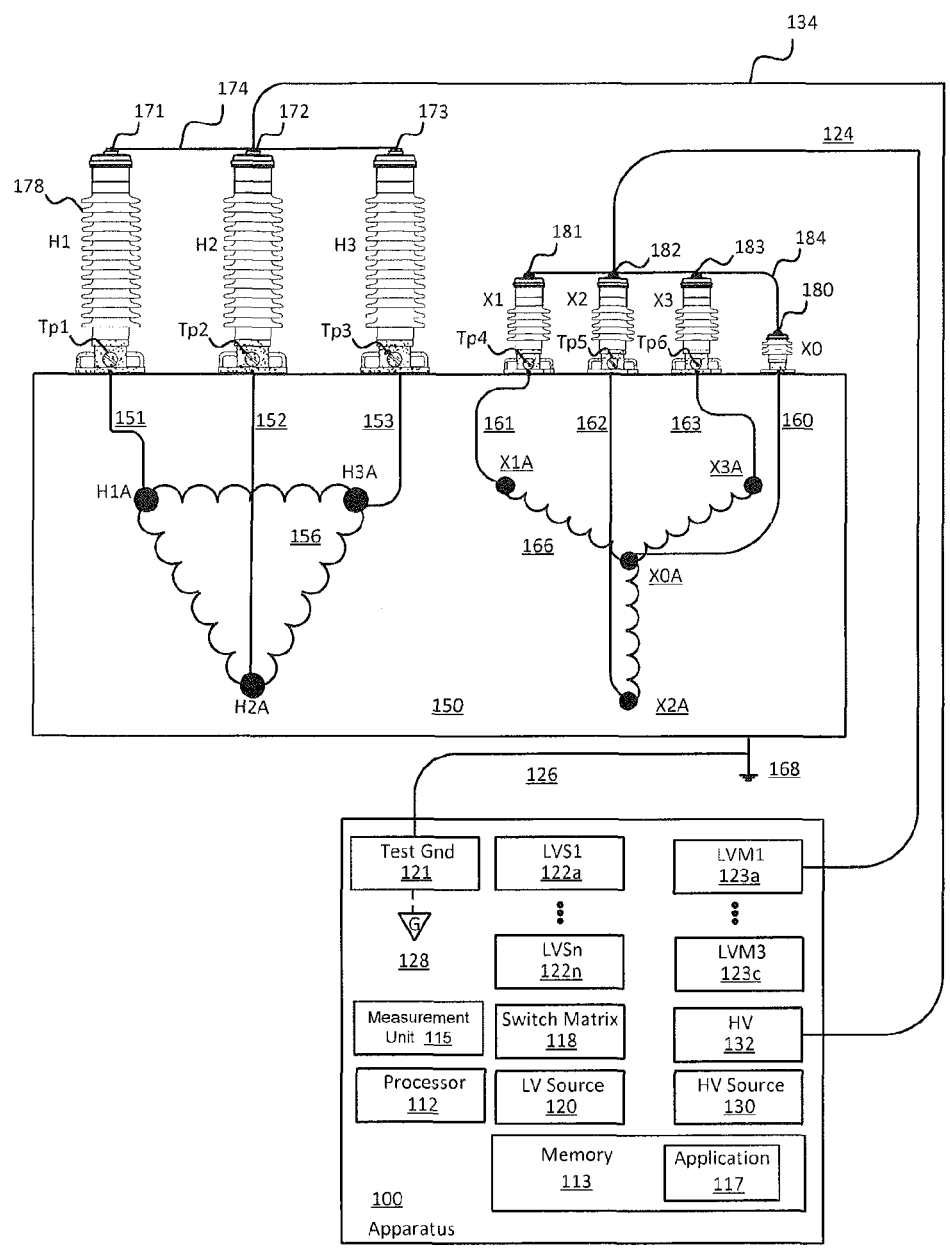
FIG. 1A illustrates an exemplary test measurement on a utility power device in a related art method, using a low voltage lead and a high voltage lead.
Figure 2A:
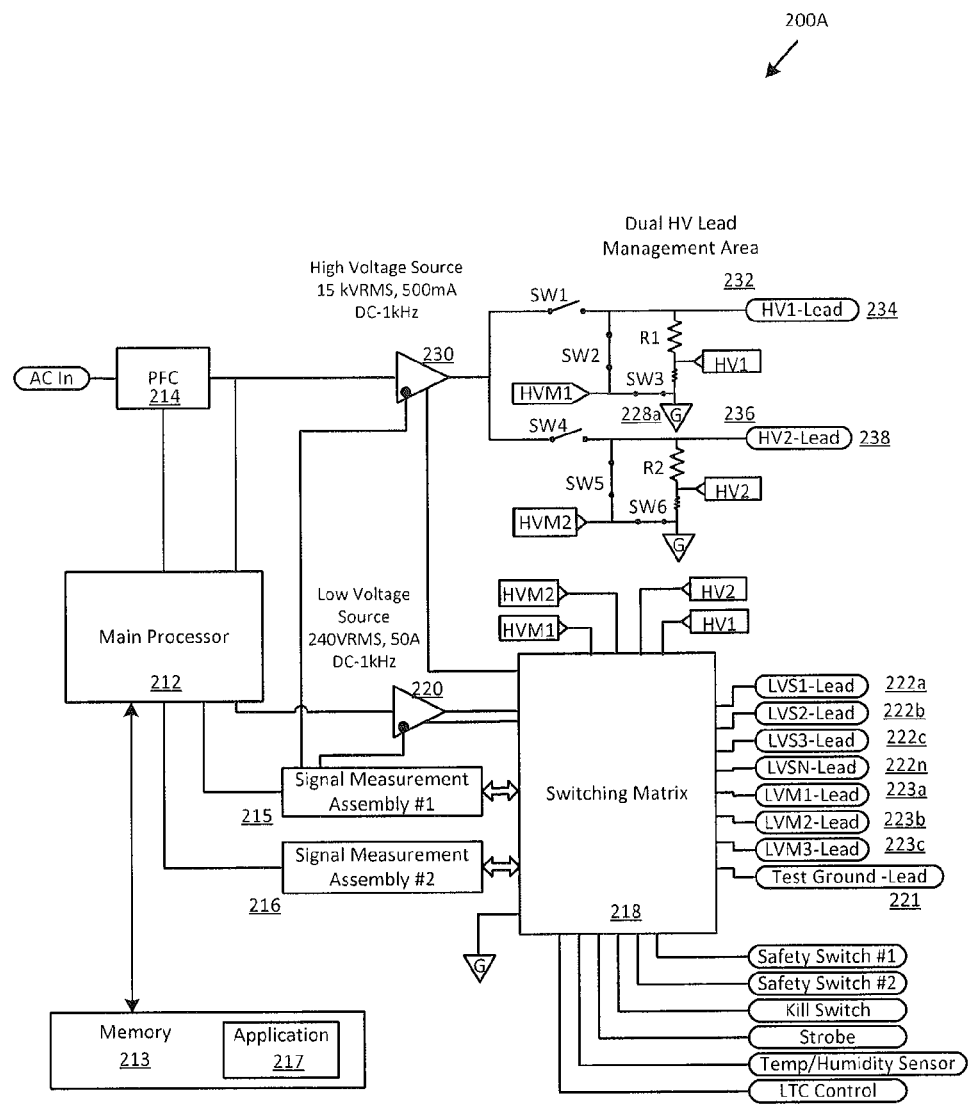
FIG. 2A illustrates an exemplary schematic block diagram of an apparatus used for test measurements on a utility power device using two high voltage leads, according to an embodiment.

FIG. 2A illustrates an exemplary schematic block diagram of test equipment (200A) for performing measuring characteristics of a utility power device. The test equipment (200A) includes two high voltage leads HV1 (234) and HV2 (238) that couple the test equipment (200A) to the utility power device. The test equipment (200A) also includes a main processor (212), switching matrix (218), a memory (213), low voltage leads LVS1 to LVSN (222a-222n), low voltage measurement leads LVM1 to LVM3 (223a-223c), and a test ground lead (221)) which may perform similar functions as those already described in FIG. 1A.

Instruction code for controlling the test equipment (200A) is stored in the memory (213) and is operable to cause the test equipment (200A) to perform the test routines of the various embodiments disclosed in the application, which includes controlling the configuration of the two high voltage leads HV1 (234) and HV2 (238) and controlling the logic for switching a plurality of switching networks, each having a plurality of high power relays.

With regard to FIG. 2A, the test equipment (200A) may include a dual high voltage lead management area (232) for selectively sending or applying a first high voltage signal (HV1) and a second high voltage signal (HV2) for selecting the measurements of respective electrical parameters in first and second return signals, which correspond to the applied first high voltage signal (HV1) and the second high voltage signal (HV2), respectively. The dual high voltage lead management area (232) may include at least a first switching network and a second switching network. The first switching network may include at least two high power relays SW1 and SW2, and at least a low power switch SW3. The second switching network may include at least two high power relays SW4 and SW5, and at least a low power switch SW6.

In addition, the first and the second switching network may each include corresponding high precision impedance components (Z1, Z2), respectively. The high precision impedance components (Z1, Z2) may be made from materials having resistive (i.e., resistors) or reactive characteristics (i.e., capacitors and/or inductors), or having any combination of both. The high precision impedance components (Z1, Z2) facilitate sampling of the corresponding first and the second high voltage signals (HV1, HV2), and may facilitate measurements of electrical parameters in the corresponding first and second return signals. The high precision impedances (Z1, Z2) may be manufactured with minimal phase shift in mind to achieve high precision in phase angle measurements. In addition, the high precision impedances (Z1, Z2) may each function as a voltage divider dropping impedance to lower the sampled HV1 and HV2 voltages and the current to a level sufficiently safe for measurements without causing damage to the signal measurement assemblies (215, 216).

The first and the second switching network may each be controlled by respective first and second switching logic through nodes (HVM1, HVM2). The nodes (HVM1, HVM2) are coupled to the switching matrix (218).

The test equipment (200A) may include a common high voltage source (230) for outputting or generating a wide range of high voltage signals (up to 15 kVRMS). In addition, the high voltage signals may include both a direct current (DC) signal as well as alternating current (AC) signals with a frequency range from DC to at least 1 kHz. The high voltage signals are digitally synthesized and generated using inputs from a power factor converter (PFC) (214) and from a signal measurement assembly (215). In addition, the common high voltage source (230) is connected to the corresponding first switching network and the second switching network to facilitate selectively sending at least the first and the second high voltage signals HV1 or HV2 to the utility power device (as shown in FIGS. 3A to 3F). Alternately, the common high voltage source (230) may simultaneously send the first and the second high voltage signals (HV1, HV2) via both high voltage leads (234, 238) to the utility power device to facilitate various test measurements on the utility power device.

The apparatus (200A) may include a common low voltage source (220) for outputting or generating a wide range of low voltage signals (up to 250 VRMS). Similar to the common high voltage signal source (230), the common low voltage source (220) may include both direct current (DC) and alternating current (AC) signals, that can operate over a frequency range from DC to at least 1 kHz. The low voltage signals are digitally synthesized and generated using inputs from a power factor converter (PFC) (214) and from a signal measurement assembly (215). In addition, the common low voltage source (220) is connected to the switching matrix (218) to facilitate selectively sending one or more low voltage signals through low voltage leads (LVS1 to LVS3) to at least the first and the second high voltage signals HV1 or HV2. Alternately, the common low voltage source (220) may send a plurality of low voltage signals simultaneously through low voltage leads LVS1 to LVS3) to facilitate testing of the utility power device.

Exemplary operations performed by the first and second switching networks in facilitating a typical test measurement on a utility power device, using the two high voltage leads (234, 238) are described below. The operations include:

- Connecting of the two HV leads (234, 238) to an appropriately prepared test specimen (i.e., a utility power device)
- Closing SW1 and opening SW2 and SW3, which facilitates sending of high voltage signal HV1 via a first high voltage lead (234))
- Opening SW4 and SW6, and closing SW5, which facilitates the use of the second high voltage lead (238) as a measurement lead.
- Repeating the above steps using different voltages or frequencies, or using different switching matrix (218) via operations that include:
  - Setting switching matrix (218) appropriately
  - Ramping the common high voltage source (230) to the next test voltage at the initial frequency
  - Making another measurement via the second high voltage lead (238), and/or via a Test Ground lead (221), or in combination with an additional low voltage lead (one of LMV1 (223a) to LMV3 (223c))

The operations continue with ramping of the voltage HV1 down to zero

Ramping the high voltage source (230) to the test voltage HV1) at a next frequency Making another measurement (via high voltage lead (238) and/or via Test Ground lead (221), or in combination with an additional low voltage lead (one of LMV1 (223a) to LMV3 (223c)

Ramping the voltage HV1 down to zero

Reporting measurement results to the apparatus (200A) or to a computing device

Repeat the above test with different switching matrix settings.

Closing SW4, and opening SW5 and SW6, which facilitates sending of high voltage signal HV2 via a second high voltage lead (238).

Opening SW1 and SW3, closing SW2, which facilitates using high voltage lead (234) as a measurement lead Repeating the same tests of HV1 in the above measurements with different switching matric settings, voltage range and frequency range.

Figure 3A:
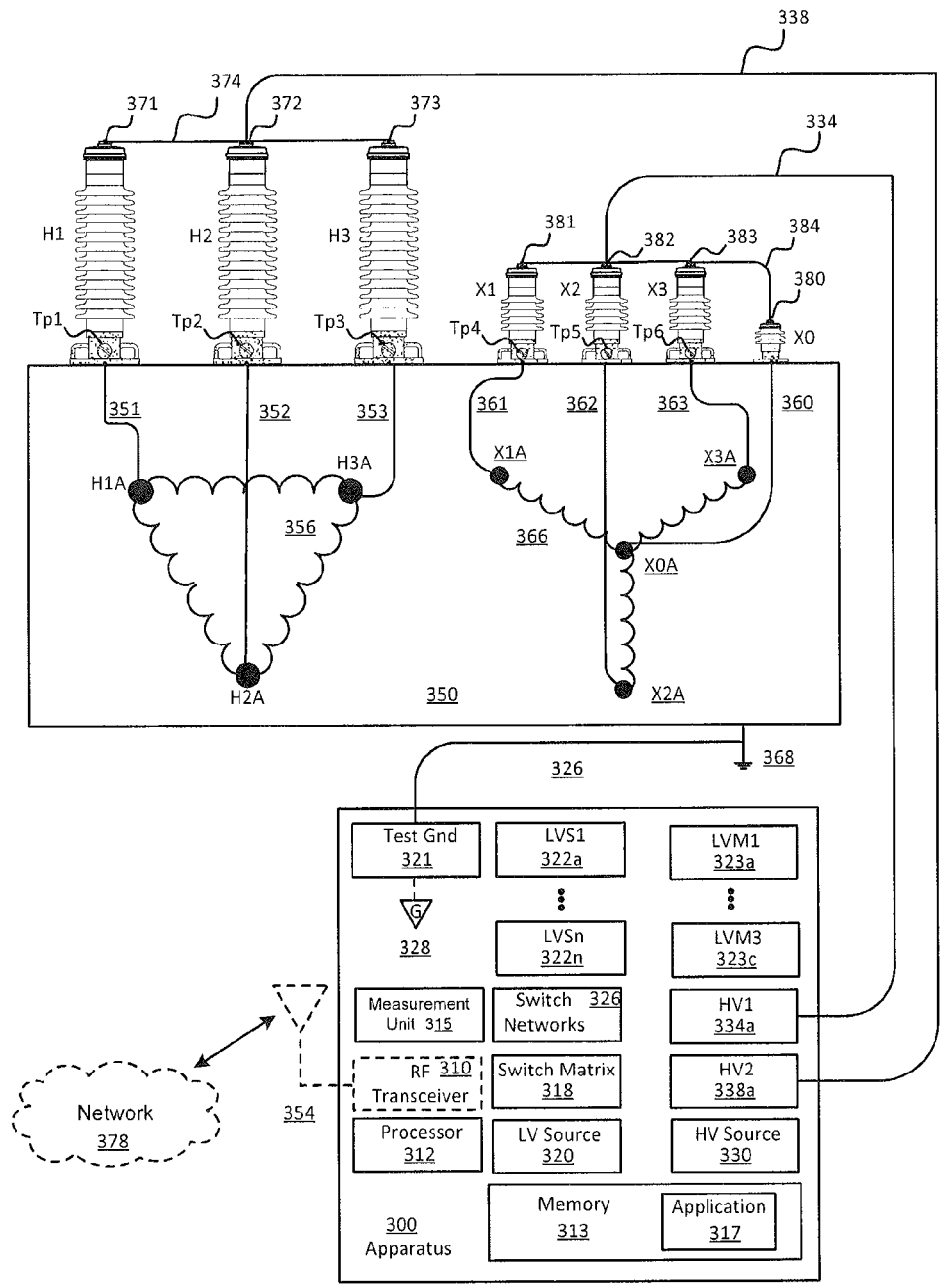
FIG. 3A illustrates an exemplary apparatus for carrying out test measurements on an exemplary utility power device as shown in FIGS. 1A and 1B, using two high voltage leads, according to an embodiment.
Figure 3B:
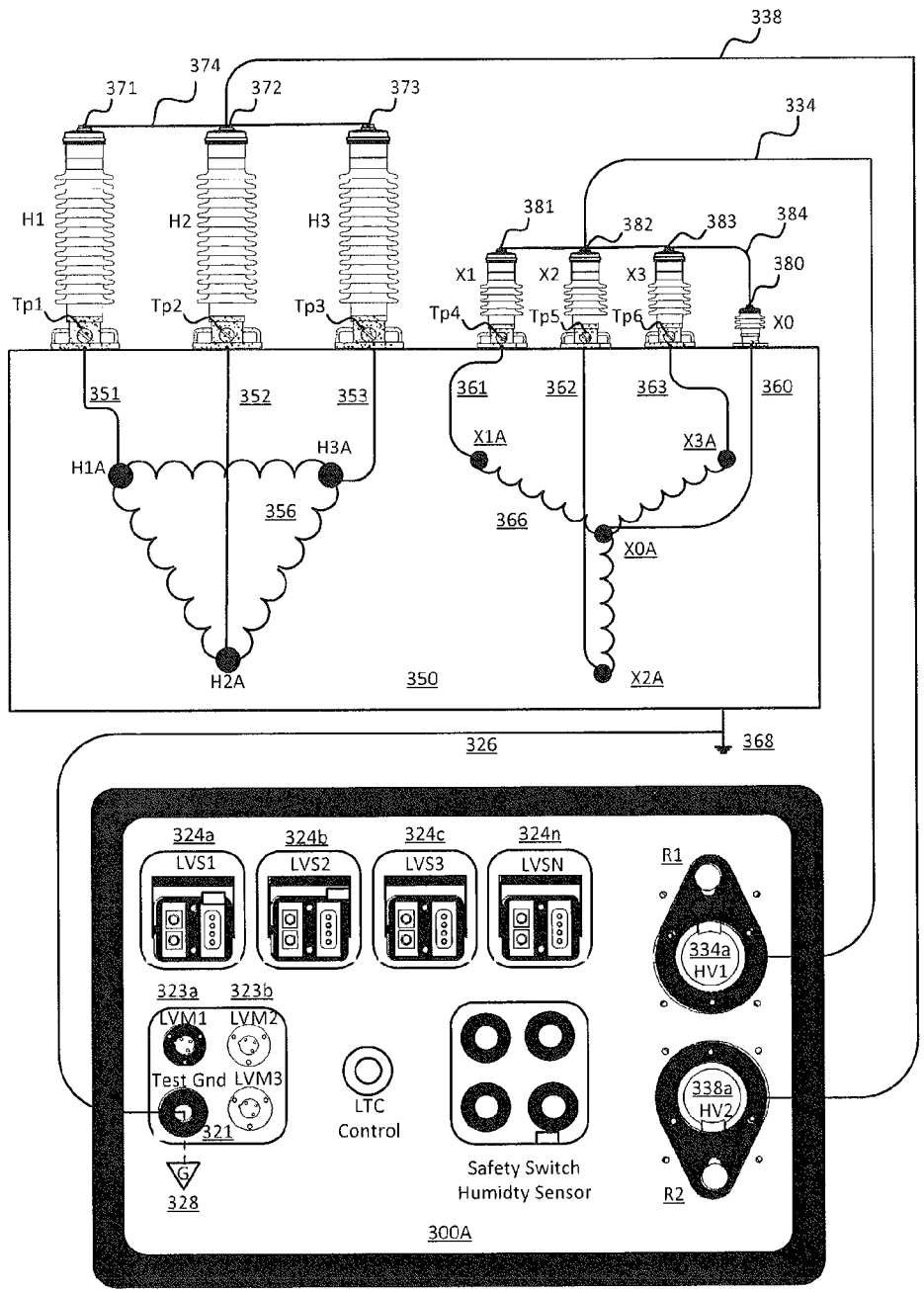
FIG. 3B illustrates a pictorial exemplary apparatus for carrying out identical test measurements on an exemplary utility power device as shown in FIG. 3A, using two high voltage leads, according to an embodiment.
Figure 3C:
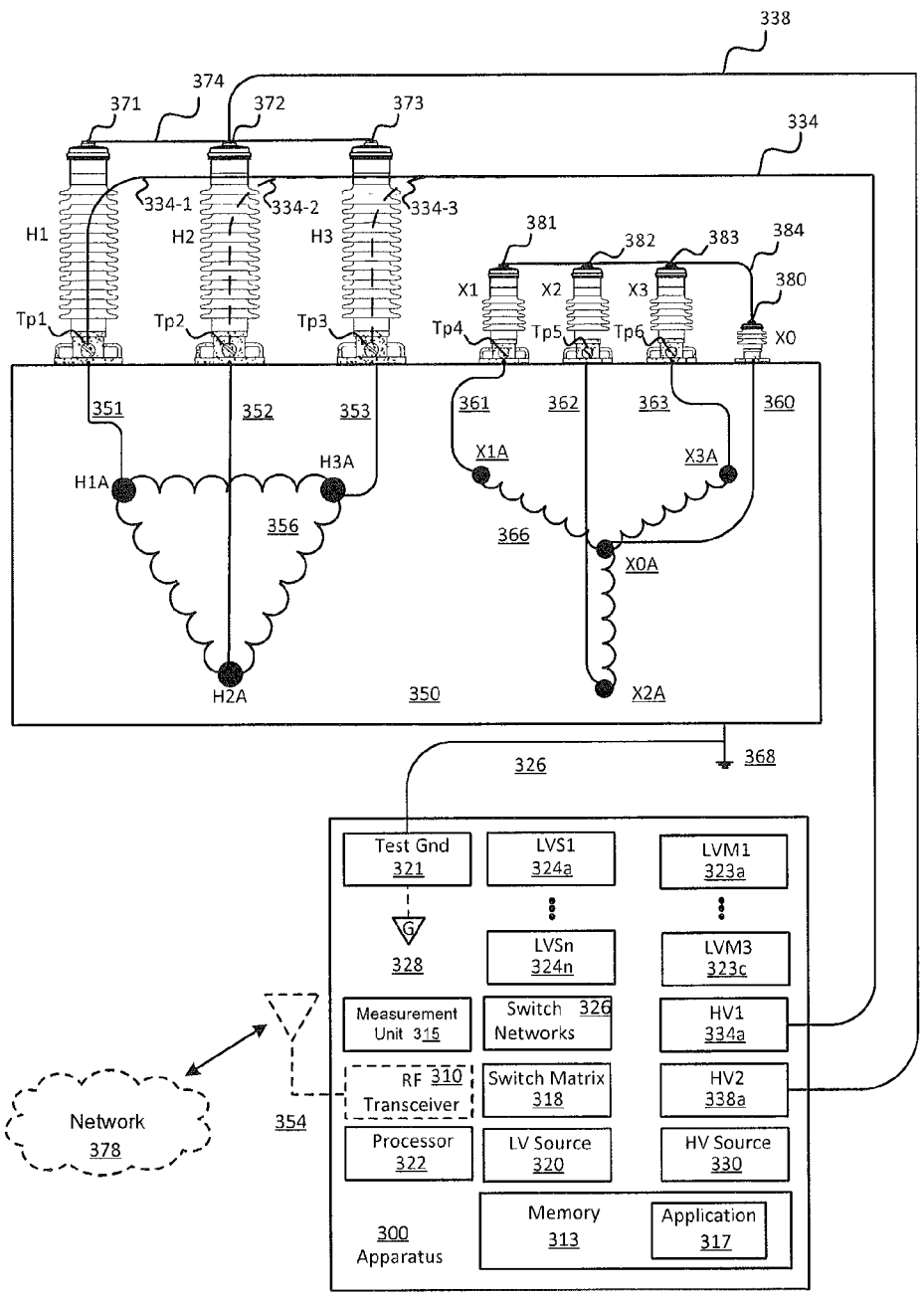
FIG. 3C illustrates another exemplary apparatus for carrying out test measurements on an exemplary utility power device as shown in FIGS. 1C and 1D, using two high voltage leads, according to an embodiment.
Figure 3D:
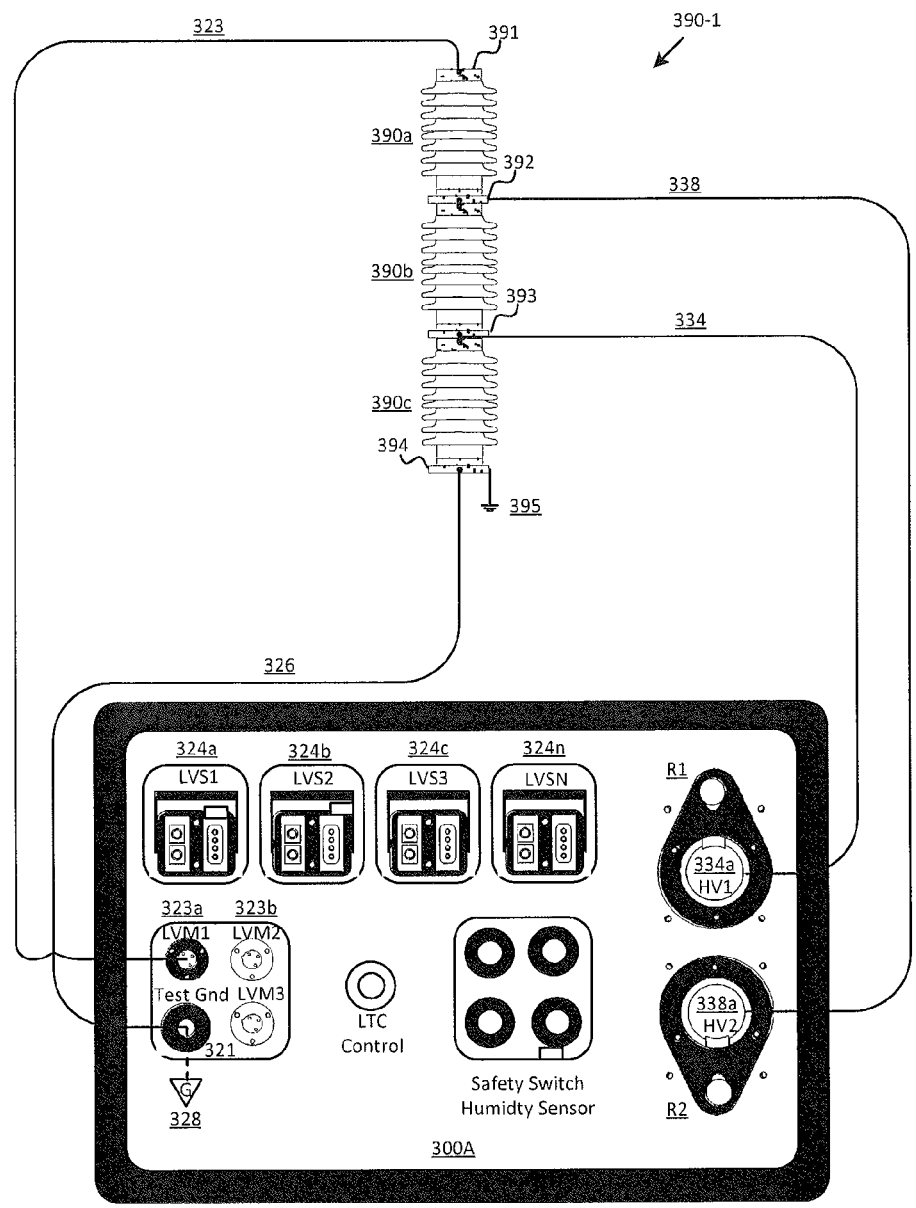
FIG. 3D illustrates a pictorial exemplary apparatus for carrying out test measurements on an exemplary utility power device (e.g., a triple stack surge arrestors) using two high voltage leads and a low voltage leads, according to an embodiment.
Figure 3E:
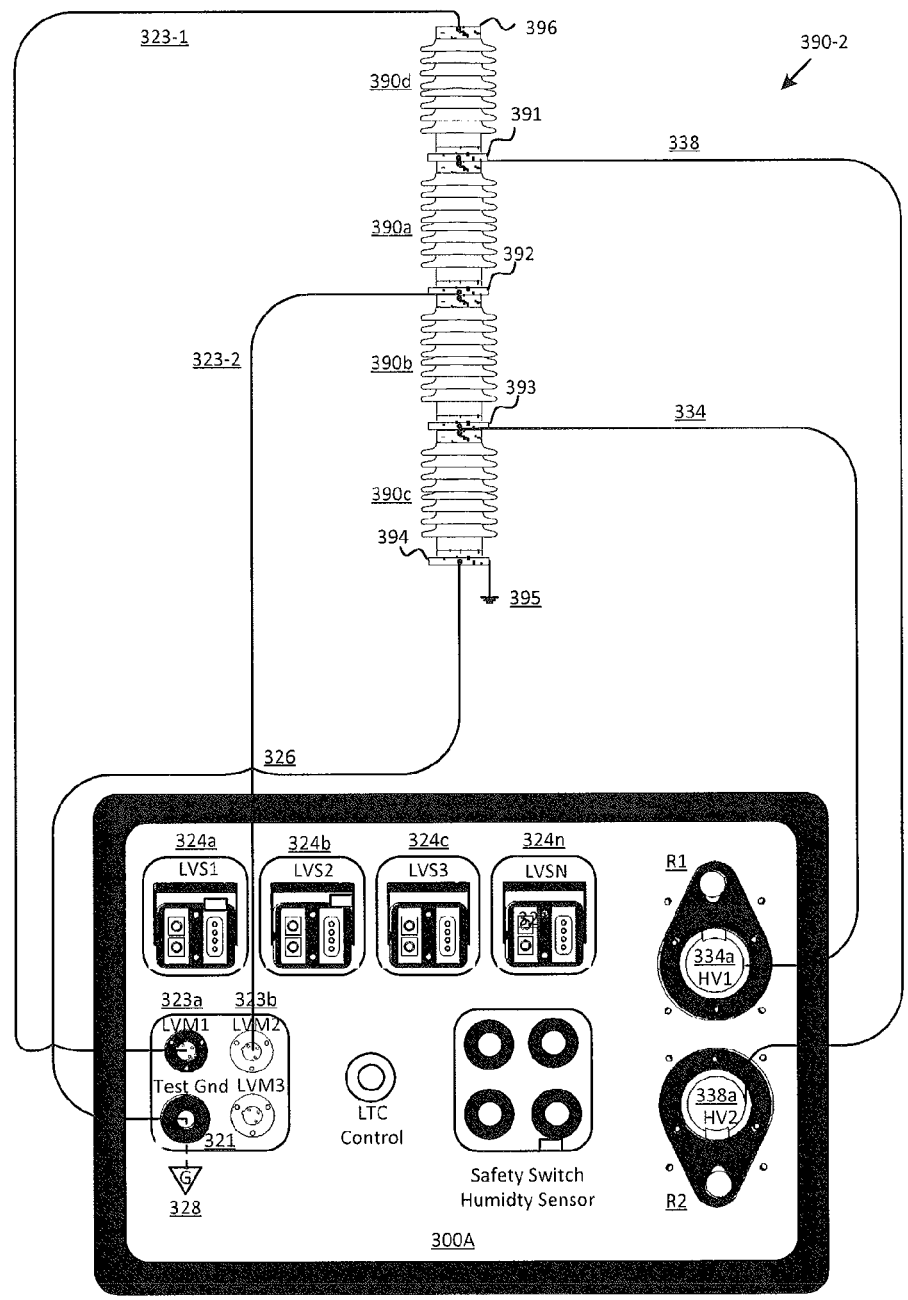
FIG. 3E illustrates a pictorial exemplary apparatus for carrying out test measurements on an exemplary utility power device (e.g., quadruple stack surge arrestors) using two high voltage leads and two low voltage leads, according to an embodiment.
Figure 3F:
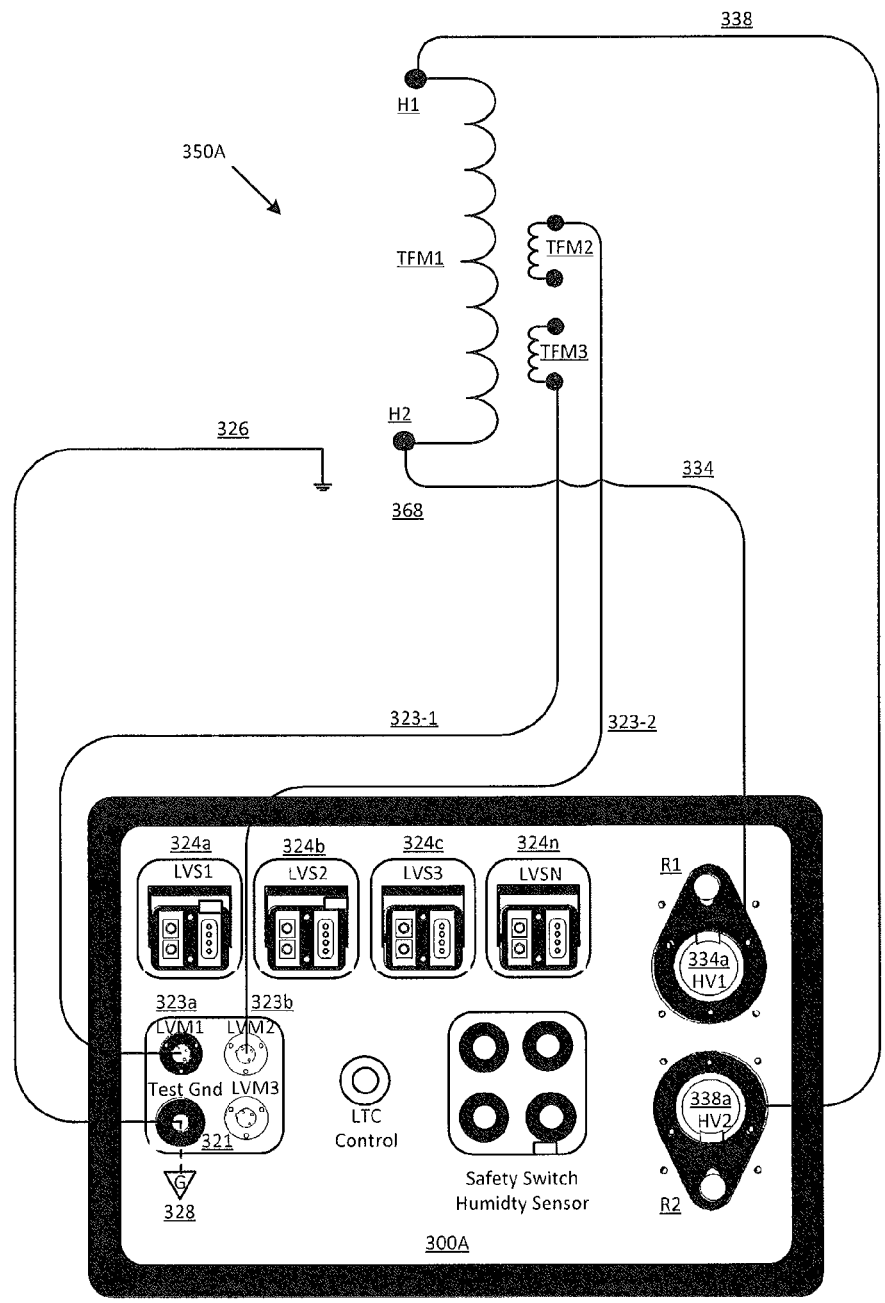
FIG. 3F illustrates a pictoral exemplary apparatus for carrying out test measurement on a utility power device, where high voltages signals may be simultaneously applied to both high voltage leads, or to one of the high voltage leads sequentially, and using two low voltage leads and a ground lead for return signals measurements, according to an embodiment.
Figure 4:
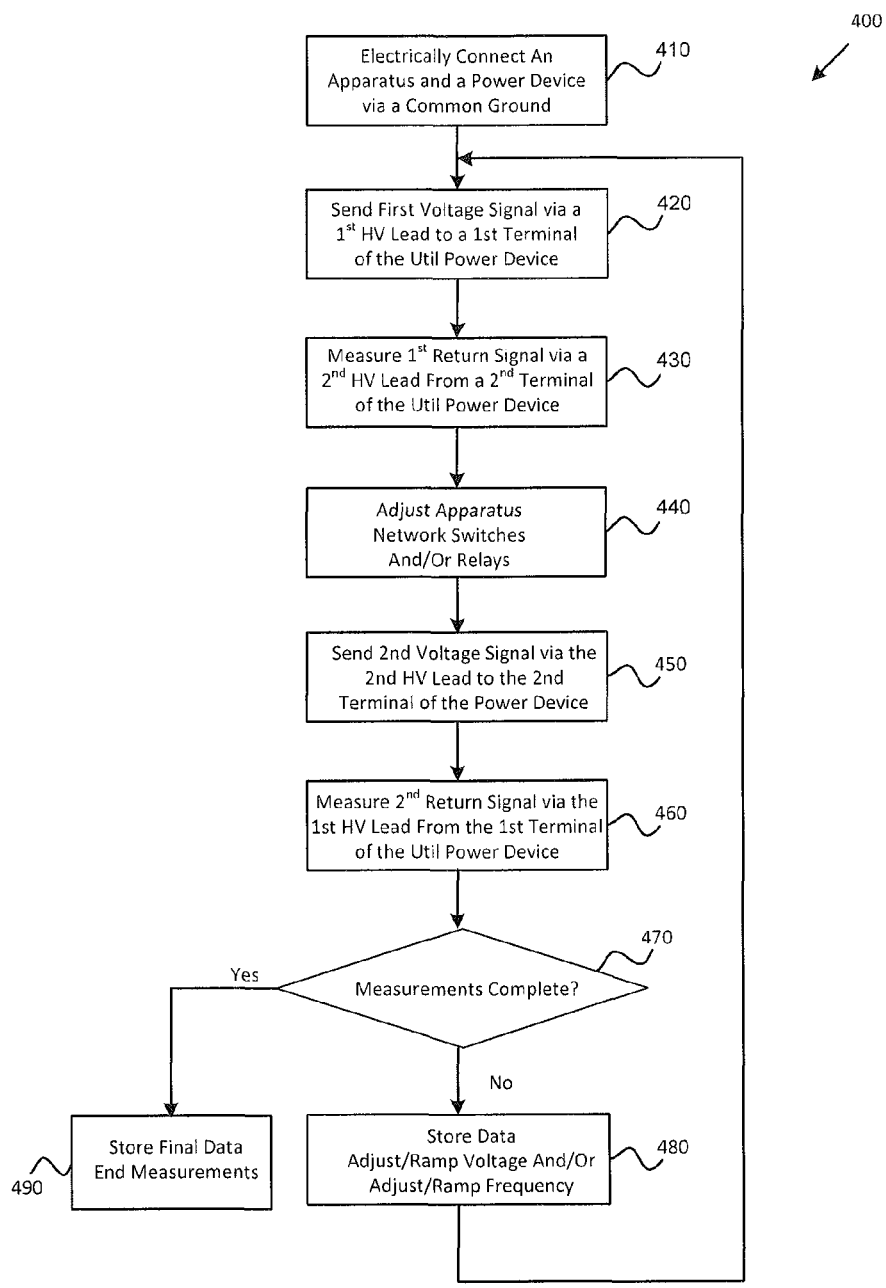
FIG. 4 is a flow chart which illustrates exemplary steps for test measurements on an exemplary utility power device using two high voltage leads, according to an embodiment.

The above exemplary steps and operations may be implemented by the various embodiments of FIGS. 3A to 3F, and summarized by a flow chart in FIG. 4.

Figure 2B:
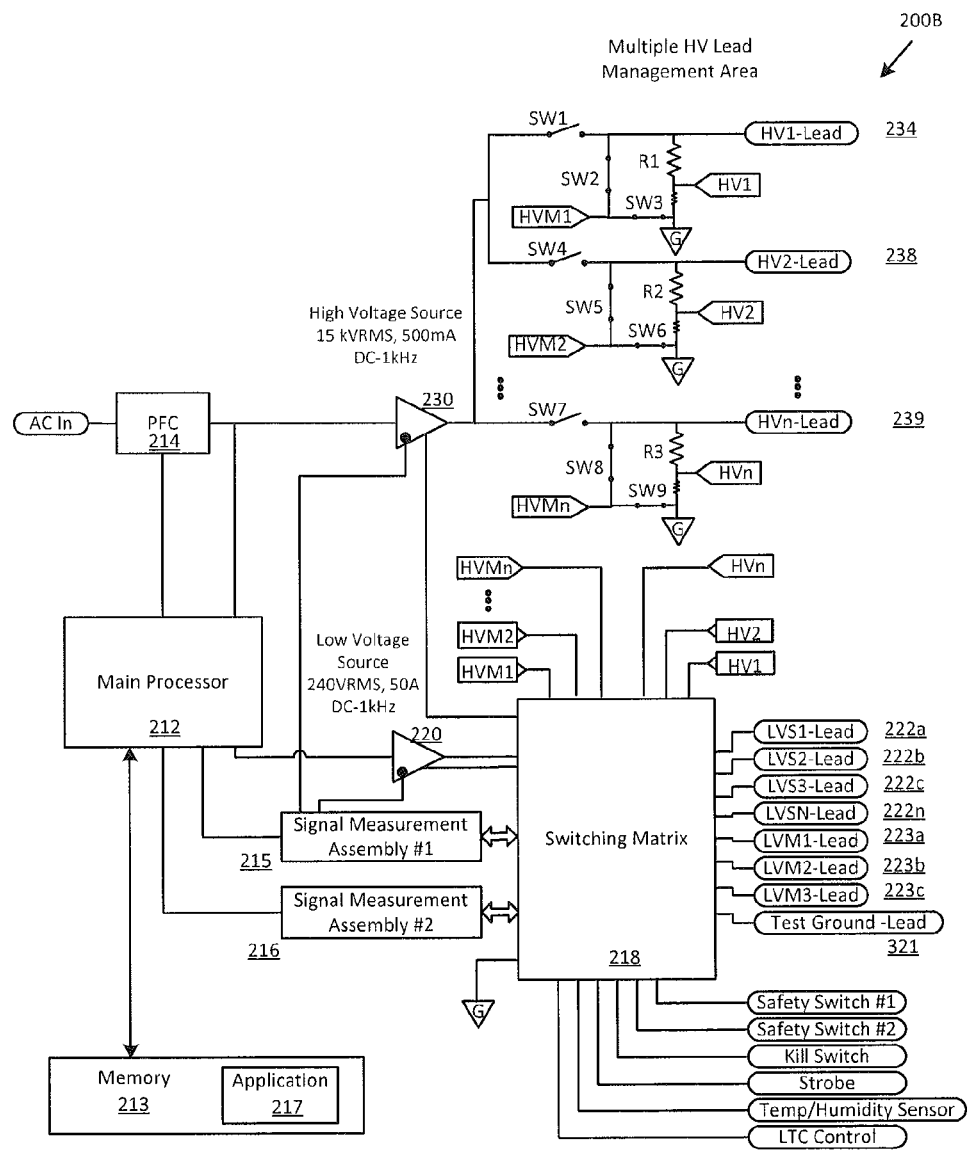
FIG. 2B illustrates an exemplary schematic block diagram of an apparatus used for test measurements on a utility power device using more than two high voltage leads, according to an embodiment.

FIG. 2B illustrates another embodiment of a schematic block diagram of the same test equipment as shown in FIG. 2A, using more than two high voltage leads 234, 238 and 239) for performing test measurements on a utility power device. More specifically, the test equipment (200B) includes n high voltage leads (239), where n is greater than two (e.g., 3, 4, 5, . . . n). Accordingly, the common high voltage source (230) may source n high voltage signals (HV1 to HVn) via at least n switching networks. The advantages of using more than two high voltage leads is better understood with reference to the embodiments to be illustrated at least in FIG. 3C.

Figure 1B:
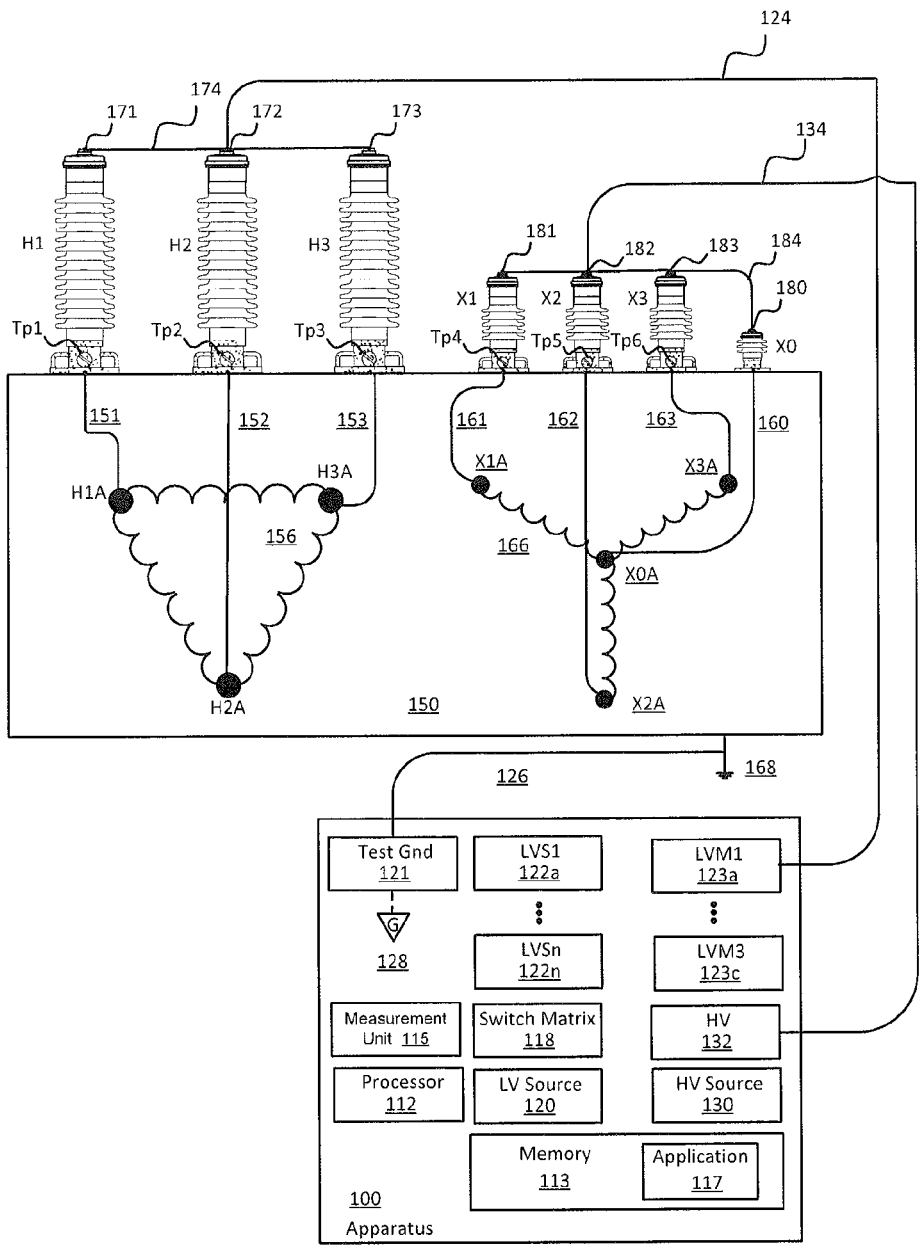
FIG. 1B illustrates the same exemplary test measurement on a utility power device in a related art method as in FIG. 1A, except carrying out by reversing the low voltage lead and the high voltage lead.

FIG. 3A depicts an exemplary test equipment embodiment (300) for performing test measurements on a utility power device (350), such as the utility power device shown in FIGS. 1A and 1B, using two high voltage leads (324, 328). The test setup configuration of FIG. 3A, in effect, replaces the test setup configuration of FIGS. 1A and 1B. Simply put, the test setup configuration of FIG. 3A performs the test measurements illustrated in both FIGS. 1A and 1B.

An exemplary power factor test to the high voltage winding side (356) according to FIG. 3A may be carried out performing operations that include:

(1) Placing of the high voltage lead (338) on the bus wire (374) of the high voltage windings (356) (i.e., to all three terminals on the Delta-connected transformer windings), connecting the other high voltage lead (334)) on the bus wire (384) of the low voltage windings (366) (to all three terminals on the Wye-connected transformer windings), and electrically coupling the TEST-GND port (321) of the apparatus (300) to the chassis ground (368) of the utility power device (350) via the ground lead (326).

(a) Configuring the switching matrix (318) to connect the high voltage lead (334) to TEST-GND port (321) (i.e., by internally routing through the first and second switching networks, the high voltage port HV1 (334a) to the TEST-GND port (321)).

(b) Configuring measurement unit (315) to measure current to the TEST-GND port (321) (i.e., measuring electrical parameters on both the current from the ground lead (326) and the high voltage lead (334)).

(c) Sending or applying a high voltage signal (HV2) from high voltage port HV2 (338a) via the high voltage lead (338) to the bus wire (374) of the high voltage windings (356), measure the applied high voltage signal (HV2), and the current in the measurement unit (315) (i.e., measuring electrical parameters on both the current from the ground lead (326) and the high voltage lead (334)).

(2) Continuing with the same leads (334, 338, 326) arrangement for the setup configuration as in FIG. 3A:

(a) Configuring switching matrix (318) to connect the high voltage lead (334) to GUARD point G (328) (i.e., by internally routing through the first and second switching networks, the high voltage port HV1 (334a) to the GUARD point (328) to by-pass the current in the high voltage lead (334)).

(b) Configuring measurement unit (315) to measure current to TEST-GND port (321).

(c) Sending or applying a high voltage signal (HV2) from high voltage port HV2 (338a) via the high voltage lead (338) to the bus wire (374) of the high voltage windings (356), measuring electrical parameters on the applied voltage (HV2), and the current in the measurement unit (315) (i.e., measuring electrical parameters on only the current from the ground lead (326).

(3) Continuing with the same leads (334, 338, 326) arrangement for the setup configuration as in FIG. 3A:

(a) Configuring switching matrix (318) to connect TEST-GND port (321) to GUARD point (328) (i.e., by internally routing through the first and second switching networks, the TEST-GND port (321) to the GUARD point (328) to by-pass the current in the ground lead (326)).

(b) Configuring measurement unit (315) to measure current to the high voltage lead (334).

(c) Measuring applied voltage (HV2), and the current in the measurement unit (315) (i.e., measuring electrical parameters on only the current from the high voltage lead (334)).

The second procedure of the power factor test on the low voltage winding side (366) may be carried out by simply applying a high voltage signal (HV1) from high voltage port HV1 (334a) via the high voltage lead (334) to the bus wire (384) of the low voltage windings (366). Accordingly, the same steps (1) to (3) may be followed above without having to change any of the high voltage leads (334, 338), which have already been connected to the utility power device (350). Measurements of electrical parameters may be taken via the high voltage lead (384), which has been connected to the bus wire (374) of the high voltage windings (356) during the initial set up.

Optionally, the test measurements or the test results may be time stamped and communicated via a wireless network (378) to an off-site server or to a remote offsite storage using an RF transceiver (310).

As seen, the power factor test measurements according to FIG. 3A to the high side windings (356) and the low side windings (366) of the utility power device (350), have altogether eliminated the need for a field worker to stop to change high voltage leads (334, 338) on the utility power device (350). Accordingly, the overall testing time is thus shortened, and the field worker would not need to regain access to the utility power device (350).

FIG. 3B illustrates an exemplary access panel (300A) of test equipment, which performs the test measurement described above with reference to FIG. 3A using two high voltage leads (334, 338). The panel (300A) representation of the exemplary test equipment (300B) includes all the functions and elements as depicted in FIG. 3A. For the sake of consistency, the panels described below in the remaining embodiments share identical reference designations with those of the panel (300A) as in FIG. 3B.

The test measurements illustrated in FIG. 3C demonstrate the benefits from using two high voltage leads (334 or 338). The same test measurements in FIG. 3C, in fact, may utilize more than two high voltage leads (not shown in the figure) to illustrate further advantages in the description to follow.

Figure 1C:
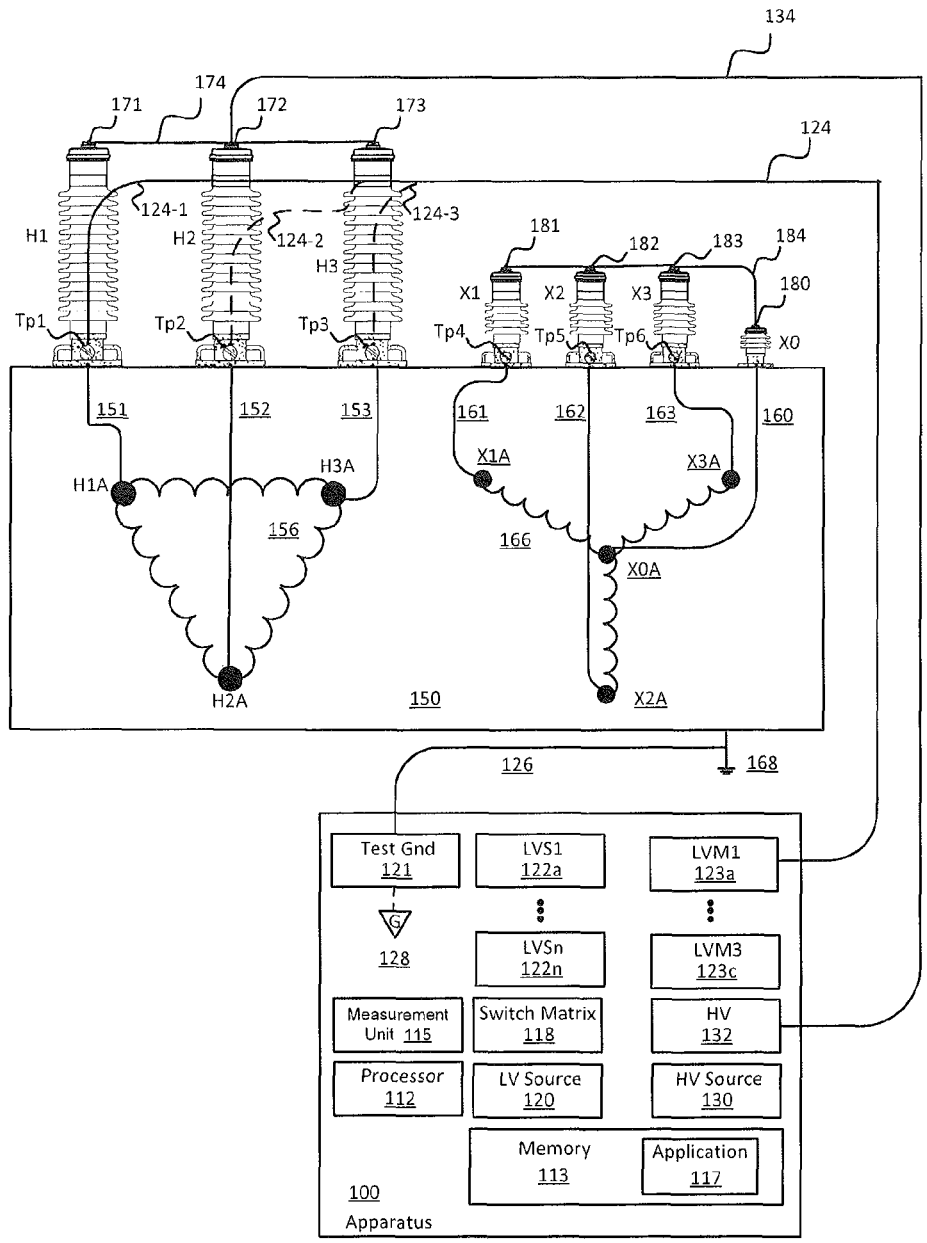
FIG. 1C illustrates another exemplary test measurement on high voltage side terminals of a utility power device in a related art method, using a low voltage lead and a high voltage lead.
Figure 1D:
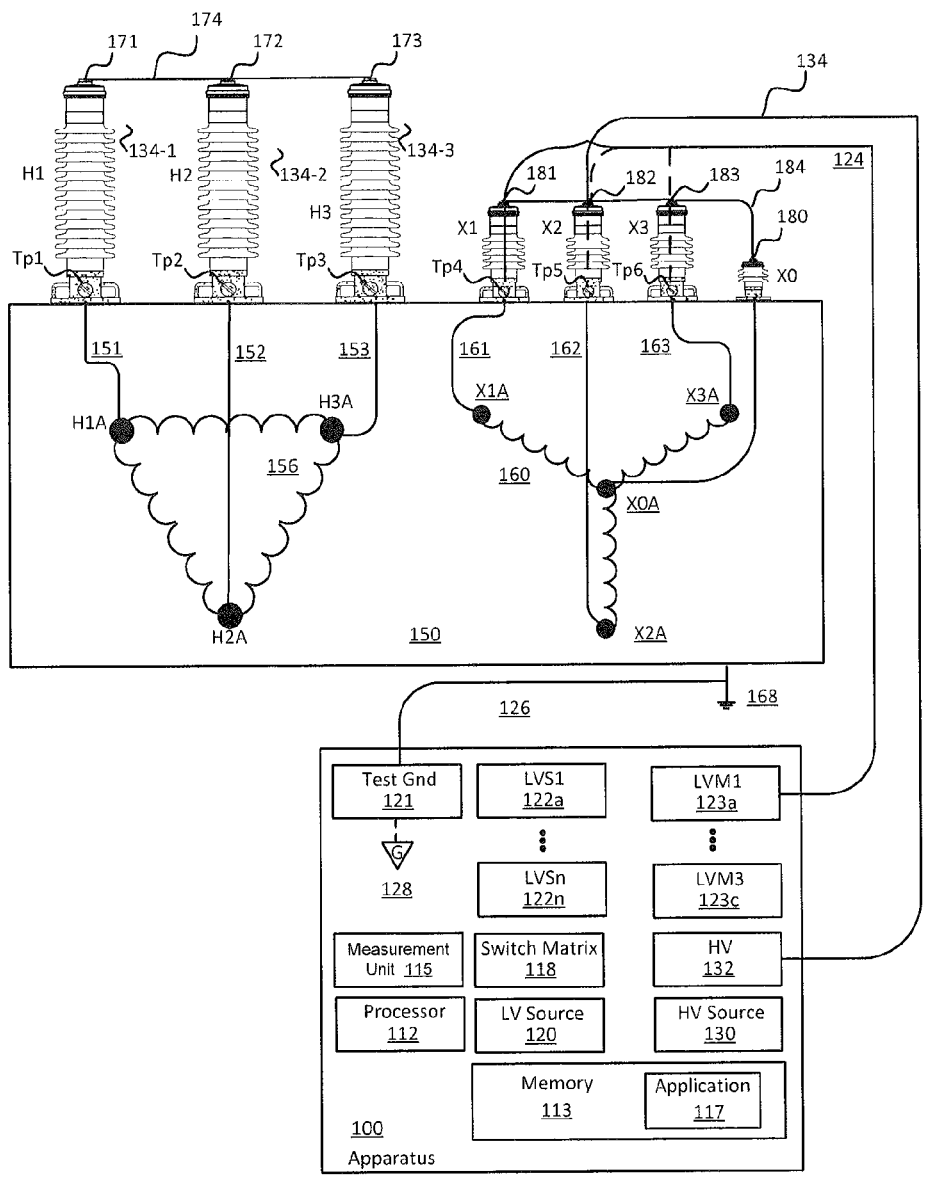
FIG. 1D illustrates another exemplary test measurement on low voltage side terminals of a utility power device in a related art method, using a low voltage lead and a high voltage lead.

The test procedure described in the setup configuration of FIG. 3C is applicable to the test routines of both FIGS. 1C and 1D by simply using a second high voltage lead (334 or 338) to connect to an electrode tap (e.g., Tp1 to Tp6) of a corresponding high voltage bushing (H1 to H3) or to a low voltage bushing (X1 to X3).

An exemplary power factor test to the high voltage bushing (H1, H2 and H3) according to FIG. 3C may be carried out as by performing operations that include:

(1) Placing of the high voltage lead (338) on the bus wire (374) of the high voltage indings (356) (i.e., to all three terminals on the Delta-connected transformer windings), connecting the other high voltage lead (334) to the tap electrode (Tp1) of the bushing (H1), and electrically coupling the TEST-GND port (321) of the apparatus (300) to the chassis ground (368) of the utility power device (350) via the ground lead (326).
  (a) Configuring switching matrix (318) to connect TEST-GND port (321) to GUARD point (328) (i.e., by internally routing through the first and second switching networks, the TEST-GND port (321) to the GUARD point (328) to by-pass the current in the ground lead (326)).
  (b) Configuring measurement unit (315) to measure current to the high voltage lead (334) via high voltage port (334a).
  (c) Measuring applied voltage (HV2), and the current in the measurement unit (315) (i.e., measuring only the current returned from the high voltage lead (334)).
  (d) Configuring switching matrix (318) to connect the high voltage lead (338) to GUARD point (328) (i.e., by internally routing the first and second switching networks, the high voltage port (HV2) (338a) to the GUARD point (328) to by-pass the current in the high voltage lead (338)).
  (e) Configure measurement unit (315) to measure current to the TEST-GND port (321).
  (f) Measure applied voltage (HV1), and the current in the measurement unit (315) (i.e., measuring only the current returned from the ground lead (326)).

(2) Continuing with the same leads (338, 326) arrangement for the set up in FIG. 3C, except connecting the high voltage lead (334) to the tap electrode (Tp2), and repeating the same tests (1a-1g) for the bushing (H2).

(3) Continuing with the same leads (338, 326) arrangement for the set up in FIG. 3C, except connecting the high voltage lead (334) to the tap electrode (Tp3), and repeat the same tests (1a-1f) for the bushing (H3).

Likewise, the same power factor measurements on the low voltage bushings (X1 to X3) on the low voltage windings (166) may be implemented using a similar test setup as the configuration of FIG. 3C, except that the high voltage lead (338) is now connected to the bus wire (384) of the low voltage windings (366), and the high voltage lead (334) is now connected to the tap electrode (Tp4) of low voltage bushing X1. Accordingly, the same testing procedure of steps (1) to (3) would can carried out for the low voltage bushings (X1 to X3).

It should be noted that in carrying out steps (1) to (3) according to FIG. 3C, the field worker would need to stop only twice (i.e., in step (2) and step (3)) in order to complete the power factor testing on either the high voltage bushings (H1 to H3) or the low voltage bushings (X1 to X3). Therefore, the field worker would need to stop and regain access to the utility power device (350) altogether only four times in both tests, compared to ten times using the related art method as illustrated in FIGS. 1C and 1D. In this regard, the testing efficiency on the utility power device (350) and the risk exposure to the field worker would be improved by more than 50 percent.

In addition, the test setup configuration illustrated in FIG. 3C may be enhanced by using a four high voltage lead test setup configuration (not shown). The four high voltage lead setup may be configured as follows: a first high voltage lead may be connected to the bus wire (374), the other three high voltage leads may be connected to each of the three tap electrodes (Tp1 to Tp3), respectively. The switching matrix (318) may be programmed to control the internal switching of the corresponding high voltage relays and the corresponding low voltage switches within the plurality of network switches, and the routing of the proper ports to the Guard point (328). Accordingly, the return signals may be measured via the respective three of the high voltage ports, and the Test Ground port (321).

In using the four high voltage lead setup configuration, the entire power factor test routine for all three high voltage bushings (H1 to H3) may be carried out uninterrupted without any voltage lead changes at all. Likewise, the power factor tests for all three low voltage bushings (X1 to X3) may be carried out without interruption using the same four high voltage lead test setup configuration, except that one of the four high voltage leads would be connected to the low voltage side bus wire (384), and the remaining three high voltage leads would be connected to the three electrode taps (Tp4-Tp6), respectively. Consequently, the described embodiment of using the four high voltage leads may substantially shorten the testing time, while completely eliminating any need to regain access to the utility power device (350) in carrying out steps (1) to (3).

FIG. 3D illustrates an exemplary test panel (300A) for carrying out another exemplary test measurements on a utility power device, such as a triple stack surge arrestors (390-1), using two high voltage leads (334, 338) and additional low voltage leads (323, 326), according to an embodiment of the invention.

Utility power devices such as surge arrestors are important protective devices used on electric systems to ensure operation continuity despite repeated voltage surges resulting from lightning or from switching (e.g., substation grid current re-route). Surge arrestors may be stacked in series for high voltage protection. Testing of stacked surge arrestors requires testing the individual surge arrestors. Therefore, using the related art method would require multiple lead changes to complete the tests. More information about the surge arrestors their testing using related art methods may be found in chapter six of the "Doble Test Procedures", which is incorporated by reference.

FIG. 3D depicts a triple stack arrestor (390-1), which is formed by stacking three individual arrestors (390a, 390b, 390c). The testing of the individual arrestors (390a, 390b, 390c) on the triple stack arrestor (390-1) may be carried out by performing operations that include:

1) Placing high voltage leads (334, 338), low voltage lead (323) and ground lead (326) as shown in FIG. 3D.
2) Testing the bottom surge arrester (390*c*):
   a. Configuring switching matrix (318) to connect low voltage port LVM1 (323*a*) and high voltage port HV2 (338*a*) to GUARD point (328).
   b. Configuring measurement unit (315) to measure current to TEST-GND port (321).
   c. Connecting HV1 port (334*a*) to high voltage common source (320).
   d. Applying high voltage signals to HV1 port (334*a*).
   e. Measuring applied high voltage (HV1), and current in the measurement unit (315).
3) Testing middle arrester (390*b*)
   a. Configuring switching matrix (318) to connect low voltage port LVM1 (323*a*) and TEST-GND port. (321) to GUARD point (328).
   b. Configuring measurement unit (315) to measure HV1 port (334*a*).
   c. Connecting HV2 port (338*a*) to high voltage common source (320).
   d. Applying high voltage signals to HV2 port (338*a*).
   e. Measuring applied high voltage HV2, and current in the measurement unit (315).
4) Testing top arrester (390*a*)
   a. Configuring switching matrix (318) to connect low voltage port LVM1 (323*a*) to TEST-GND port (321).
   b. Configuring switching matrix (318) to connect HV1 port (334*a*) to GUARD point (328).
   c. Configuring measurement unit (315) to measure TEST-GND port (321).
   d. Connecting HV2 port (338*a*) to high voltage common source (320).
   e. Applying high voltage signals to HV2 port (338*a*).
   f. Measuring applied high voltage, and current in the measurement unit (315).

It should be noted that the testing of the triple stacked surge arrestors (390-1) using the two high voltage lead (334, 338) setup method may be carried out uninterrupted without having to stop any of the above steps (1) to (4), or changing any high voltage leads (334, 338). Compared with using a single high voltage lead in the related art method, the test would require the field worker to stop and move the single high voltage lead at least once to complete the remaining surge arrestor test.

Likewise, the same test panel (300A) may be used to carry out test measurements on a quadruple stack surge arrestors (390-2), using two high voltage leads (334, 338) and two low voltage leads (323-1, 323-2), as shown in FIG. 3E according to another embodiment of the application.

As seen, by simply rearranging the connections between the two high voltage leads (334, 338) to connect to the connecting terminals (393, 391), and the two low voltage leads (323-1, 323-2) to connect to the surge arrestor connecting terminals (392, 396), respectively, all four surge arrestors (390*a* to 390*d*) may be tested in a modified test sequence without lead changes or interruptions.

FIG. 3F illustrates an exemplary embodiment test measurement method, where two high voltage signals (HV1, HV2) may be applied simultaneously in carrying out test measurements on a utility power device (350A), in addition to applying the two high voltage signals (HV1, HV2) in sequence.

The utility power device may be a potential transformer (PT) (350A), which may be used on high voltage power systems for voltage indication and in applications involving metering and power relaying equipment. The potential transformer (350A) may include a primary winding TFM1 with terminals H1 and H2, and a plurality of secondary windings (TFM2, TFM3).

The entire testing routine of the potential transformer (PT) (350A) may be carried out without stopping or changing any voltage leads. The PT test measurements may be carried out by performing operations that include:

1) Placing of the high voltage leads (324, 328), low voltage leads (323-1, 323-2) and ground lead (326) as shown in FIG. 3F.
2) Overall Testing by:
   a. Configuring switching matrix (318) to internally connect low voltage ports LVM1 (323*a*), and LVM2 (323*b*) to TEST-GND port (323).
   b. Configuring measurement unit (315) to measure current to TEST-GND port (323) (i.e., sum of currents from TFM2, TFM3 via low voltage leads (323-1, 323-2) and chassis ground current via ground lead (326)).
   c. Connecting high voltage ports HV1 (334*a*) and HV2 (334*b*) to high voltage common source (330).
   d. Simultaneously applying high voltage signals (HV1, HV2) via high voltage ports HV1 (334*a*) and HV2 (334*b*) to high voltage leads (334, 338).
   e. Measuring applied voltages HV1, HV2, and current in the measurement unit (315).
3) H1 terminal Cross Checking by:
   a. Configuring switching matrix (318) to internally connect low voltage ports LVM1 (323*a*), and LVM2 (323*b*) to TEST-GND port (323).
   b. Configuring switching matrix (318) to internally connect high voltage port HV2 (338*a*) to GUARD point (328).
   c. Configuring measurement unit (315) to measure current to TEST-GND port (321) (i.e., sum of currents from TFM2, TFM3 via low voltage leads (323-1, 323-2) and chassis ground current via ground lead (326))
   d. Connecting high voltage port HV1 (334*a*) to high voltage common source (330).
   e. Applying high voltage signals (HV1) to high voltage port HV1 (334*a*).
   f. Measuring applied voltage signals (HV1), and current in the measurement unit (315).
4) H2 terminal Cross Checking by:
   a. Configuring switching matrix (318) to internally connect low voltage ports LVM1 (323*a*), and LVM2 (323*b*) to TEST-GND port (323).
   b. Configuring switching matrix (318) to connect high voltage port HV1 (334*a*) to GUARD point (328).
   c. Configuring measurement unit (315) to measure current to TEST-GND port (323).
   d. Connecting high voltage port HV2 (338*a*) to high voltage common source (330).
   e. Applying high voltage signals (HV2) to high voltage port HV2 (338*a*).
   f. Measuring applied voltage signals (HV2), and current in the measurement unit (315).
5) Facilitating H1-H2 terminal excitation current by:
   a. Configuring switching matrix (318) to internally connect low voltage ports LVM1 (323*a*), and LVM2 (323*b*) to GUARD point (328).
   b. Configuring measurement unit (315) to connect GUARD point (328) to TEST-GND port (323).
   c. Configuring measurement unit (315) to measure current to H2 terminal
   d. Connecting high voltage port HV1 (334*a*) to high voltage common source (330).

e. Applying high voltage signals (HV1) to high voltage port HV1 (334a).
f. Measuring applied voltage signals (HV1), and current in the measurement unit (315).
6). Facilitating H2-H1 terminal excitation current by:
a. Configuring switching matrix (318) to internally connect low voltage ports LVM1 (323a), and LVM2 (323b) to GUARD point (328).
b. Configuring measurement unit (315) to connect GUARD point (328) to TEST-GND port (323).
c. Configuring measurement unit (315) to measure current to H1 terminal.
d. Connecting high voltage port HV2 (338a) to high voltage common source (330).
e. Applying high voltage signals (HV2) to high voltage port HV2 (338a).
f. Measuring applied voltage signals (HV2), and current in the measurement unit (315).

If the same PT test is carried out using a single high voltage lead and at least two low voltage leads in the related art method (see "Doble Test Procedures", pp. 5-19 to 5-27), the high voltage lead would have been placed on one of the terminal side (H1 or H2) to apply a high voltage, while the low voltage lead would be placed on the other terminal (H2 of H1) to make measurements. Accordingly, the high voltage lead and the low voltage lead would need to be swapped at least three times in carrying out tests (3) to (6). It should be further noted that the "Overall Test" (2) (which requires simultaneously applying of high voltages HV1 and HV2 to both terminals H1, H2) would not have been possible, using the single high voltage lead in the related art method.

FIG. 4 is a flow chart, which illustrates exemplary operations performed by an apparatus or test equipment (300 or 300A) in FIGS. 3A to 3F, in testing a utility power device using two high voltage leads.

In step (410), prior to the start of any test measurements, the apparatus (300) and the utility power device (350) are both electrically grounded to a common ground (i.e., an earth ground by default).

In step (420), after connecting the respective high voltage leads (324, 328), and ground lead (326) to the device chassis (368), and any necessary low voltage leads (e.g., 323) to the utility power device (350) according to the test set up configuration (FIGS. 3A to 3F), a common high voltage source (330) may send a first voltage signal (e.g., HV2) via a first high voltage lead (338) to a first terminal (e.g., 374 high voltage side) of the utility power device.

In step (430), the measurement unit (315) of the apparatus (300) may measure a first return signal via a second high voltage lead (334) of the apparatus from a second terminal (e.g., 384 low voltage side) of the utility power device (350).

In step (440), the apparatus (300) may internally configure a corresponding switching network to open or close one or more high voltage relays (SW1, SW2, SW4, SW5) or one or more low voltage switch (SW3, SW6) to connect a corresponding high voltage port (HV1) to the common source voltage (330).

In step (450), the common high voltage source (330) may send a second voltage signal (HV1) via the second high voltage lead (324) to the second terminal (e.g., 384 low voltage side) of the utility power device.

In step (460), the measurement unit (315) of the apparatus may measure a second return signal via the first high voltage lead (338) of the apparatus from the first terminal of the utility power device (e.g., 374 high voltage side).

In step (470), a determination may be made as to whether the measurements in a test routine have been completed.

In step (480), assuming that the measurements in a test routine are ongoing, the the apparatus may store the last measured data, the common high voltage source may perform one or both of: adjust or ramp to a next output voltage (>500V, e.g., 1 kV to 15 kV), adjust or ramp to a next test frequency (DC to 1 kHz) of the output voltage, and loop back to step (420) to repeat the test routine again.

In step (490), assuming that the measurements in a test routine have completed, the apparatus (300) may store the last measured data, reset the apparatus to preset state and end the test measurement.

It should be pointed out that the disclosure described in FIGS. 2A-2B and 3A to 3F above, may be performed on a wide range of multi windings transformers and many other utility power devices, such as circuit breakers, power and distribution transformers, current transformers, voltage regulators, meters, Askare-Filled transformers, switches, relays, reclosers, sectionalizers, cables, terminations, grading capacitors, coupling capacitors, switch banks, to name a few.

In addition, the various operations may be performed in DC or in AC mode. If in AC mode, the tests may be performed in single phase or in multiphase. The electrical parameters to be measured may include voltage, current, impedance, conductance, phase angle, transformer turns ratios, leakage currents, dielectric loss, power factor, tan delta, load burden, arcing, partial discharge, to name a few. The sequence of testing and test lead arrangements may be rearranged to accomplish the objectives of the test procedure according to what a person of ordinary skill in the art may see fit, after reviewing the disclosure of the various embodiments.

The disclosed embodiments of methods and apparatus may be used to perform many of the tests procedure on the utility power devices disclosed by both the "Doble Test Procedures" (Doble Engineering Company's Publication Number 500-0397, document 72A-2244 Rev A) and the IEEE Standard Test Code for Liquid-immersed Distribution, Power and Regulating Transformers (IEEE Std C57.12.90-2010), which are incorporated by reference in its entirety as part of the disclosure.

All or part of the operations described above in the embodiments may be implemented via instruction code/program operable to cause relevant hardware to perform the operations, and the program may be stored in a non-transitory computer readable storage medium, such as a ROM/RAM, a magnetic disk, or an optical disk, which are executed in a machine, such as in a computer, a laptop, a server, or cloud computing infrastructure.

It will be apparent to those skilled in the art that various modifications and variations can be made to the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A method of performing multiple test measurements on a utility power device, comprising:
providing an apparatus having at least a processor, at least one switching network, a common high voltage source, and having at least both a first and a second lead selectively coupled to the common high voltage source for sending and receiving high voltage signals to a first and a second terminal of the utility power device, wherein the apparatus and the utility power device both share a common ground;

coupling a first low voltage lead of the apparatus to a third terminal of the utility power device, wherein the third terminal is neither a chassis ground nor the common ground of the utility power device;

selectively sending a first high voltage signal via the first lead of the apparatus to the first terminal of the utility power device;

measuring respective first electrical parameters across the first terminal and the second terminal of the utility power device as a first corresponding signal returned via the second lead of the apparatus which is connected to the second terminal of the utility power device;

simultaneously measuring respective third electrical parameters across the first terminal and the third terminal of the utility power device returned via the first low voltage lead of the apparatus which is connected to the third terminal of the utility power device;

while the corresponding first lead, the second lead and the first low voltage lead of the apparatus remain electrically coupled to the corresponding first terminal, the second terminal and the third terminal of the utility power device, selectively sending a second high voltage signal via the second lead of the apparatus to the second terminal of the utility power device, measuring respective second electrical parameters across the second terminal and the first terminal of the utility power device as a second corresponding signal returned via the first lead of the apparatus which is connected to the first terminal of the utility power device; and simultaneously measuring respective fourth electrical parameters across the second terminal and the third terminal of the utility power device returned via the first low voltage lead of the apparatus which is connected to the third terminal of the utility power device.

2. The method according to claim 1, wherein the selectively sending of the first high voltage signal and the second high voltage signal and the measuring of the respective electrical parameters corresponding to the first and the second return signals, comprising:

internally switching a corresponding first and second switching network, each having a plurality of high voltage relays and at least one switch, wherein the internal switching comprising:

connecting the first lead and the second lead to a corresponding first switching network and a second switching network of the apparatus, respectively;

controlling the first switching network and the second switching network via a corresponding first switching logic and a second switching logic, respectively; and electrically coupling the corresponding first switching network and the second switching network to the common high voltage source via a corresponding first plurality of high voltage relays and a second plurality of high voltage relays, respectively, wherein the corresponding first plurality of high voltage relays and the second plurality of high voltage relays are each controlled by a corresponding first relay logic and a second relay logic, respectively, in order to selectively output one of: the first high voltage via the first lead, the second high voltage via the second lead, or simultaneously sending the first and the second high voltage via the first and the second lead.

3. The method according to claim 1, comprising utilizing a corresponding precision impedance in the corresponding first and second switching network, respectively, for sampling the corresponding first and the second high voltage signals, and the corresponding first and second return signals.

4. The method according to claim 1, comprising electrically coupling another low voltage lead from the apparatus to a chassis ground of the utility power device.

5. The method according to claim 1, wherein the common high voltage source performs at least one of: ramping the high voltage signal over a frequency range covering 0 Hz (DC) to at least 1 KHz (AC), and ramping the high voltage signal over a voltage range covering 1 kV to at least 15 kV.

6. The method according to claim 1, comprising:

coupling a second low voltage lead of the apparatus to a fourth terminal of the utility power device;

outputting by a low voltage source, a common low voltage signal to the third terminal of the utility power device via the first low voltage lead, wherein the low voltage source and the common high voltage source utilizes another switching network which is separate and different from the switching network for sending the first and second high voltage signals and for receiving the respective first and second corresponding signals returned via the first lead and the second lead; and simultaneously measuring respective fifth electrical parameters across the third terminal and the fourth terminal of the utility power device returned via the second low voltage lead of the apparatus which is connected to the fourth terminal of the utility power device.

7. The method according to claim 1, wherein the utility power device at least being one of: a power transformer, a current transformer, a switched capacitor bank, a circuit breaker, a recloser, a relay, a transformer bushing, a coupling capacitor and a surge arrester.

8. The method according to claim 1, wherein the electrical parameters comprise one or more of: current, voltage, phase, impedance, capacitance, transformer turns ratio (TTR), reactance leakage, dielectric loss, power factor, tan delta, load burden, partial discharge or arcing.

9. The method according to claim 1, comprising selectively routing the corresponding first or the second return signals via one or more guard points internal to the apparatus, wherein the one or more guard points are designated as signal return nodes internal to the apparatus.

10. The method according to claim 1, comprising utilizing one or more additional switching network and one or more additional leads from the apparatus for sending one or more additional high voltage signals to one or more additional terminals of the utility power device, or for receiving a corresponding one or more additional return signals from the utility power device in measuring a corresponding one or more additional electrical parameters.

11. The method according to claim 1, comprising:

coupling both the first lead and the second lead to the common high voltage source, and simultaneously sending a high voltage signal via the first lead and the second lead of the apparatus to a first and a second terminal of the utility power device; and measuring the corresponding first and the second return signals via at least one or both of the first and a second low voltage leads coupled between at least one or both of the third and a fourth terminals of the utility power device.

12. An apparatus for performing multiple test measurements on a utility power device, wherein the apparatus and the electrical utility power device both share a common ground, the apparatus comprises:

a processor;
at least one switching network,
a common high voltage source; and
a first low voltage lead of the apparatus coupled to a third terminal of the utility power device, wherein the third terminal is neither a chassis ground nor the common ground of the utility power device;
at least both a first and a second lead coupled to the common high voltage source for sending and receiving high voltage signals to a first and a second terminal of the utility power device, wherein the processor controls the apparatus to:
  selectively send a first high voltage signal via the first lead of the apparatus to the first terminal of the utility power device, and measure respective first electrical parameters across the first terminal and the second terminal of the utility power device as a first corresponding return signal received via the second lead of the apparatus which is connected to the second terminal of the utility power device;
  simultaneously measure respective third electrical parameters across the first terminal and the third terminal of the utility power device returned via the first low voltage lead of the apparatus which is connected to the third terminal of the utility power device;
while the corresponding first lead, the second lead and the first low voltage lead of the apparatus remain electrically coupled to the corresponding first terminal, the second terminal and the third terminal of the utility power device, selectively send a second high voltage signal via the second lead of the apparatus to the second terminal of the utility power device, measure respective second electrical parameters across the second terminal and the first terminal of the utility power device as a second corresponding return signal received via the first lead of the apparatus which is connected to the first terminal of the utility power device; and
  simultaneously measure respective fourth electrical parameters across the second terminal and the third terminal of the utility power device returned via the first low voltage lead of the apparatus which is connected to the third terminal of the utility power device.

13. The apparatus according to claim 12, comprises:
a corresponding first and second switching network, each having a plurality of high voltage relays and at least one switch which facilitates the selecting of the first high voltage signal and the second high voltage signal and the measuring of the respective electrical parameters corresponding to the first and the second return signals; wherein:
  the first lead and the second lead are selectively connected to the corresponding first switching network and the second switching network of the apparatus, respectively;
  the first switching network and the second switching network are controlled by a corresponding first switching logic and a second switching logic, respectively;
  the corresponding first switching network and the second switching network are electrically coupled to the common high voltage source via a corresponding first plurality of high voltage relays and a second plurality of high voltage relays, respectively; and wherein the corresponding first and the second plurality of high voltage relays are each controlled by a corresponding first and a second relay logic, respectively, to selectively sending one of: the first high voltage via the first lead, the second high voltage via the second lead, or simultaneously sending the first and the second high voltage via the first and the second lead.

14. The apparatus according to claim 13, comprises a corresponding precision impedance in the corresponding first and second switching network, respectively, for sampling the corresponding first and the second high voltage signals, and the corresponding first and second return signals.

15. The apparatus according to claim 12, wherein another low voltage lead from the apparatus is electrically coupled to a chassis ground of the utility power device.

16. The apparatus according to claim 12, wherein the common high voltage source performs at least one of: ramping the high voltage signal over a frequency range covering 0 Hz (DC) to at least 1 KHz (AC), and ramping the high voltage signal over a voltage range covering 1 kV to at least 15 kV.

17. The apparatus according to claim 12, comprises a common low voltage source coupled to a second low voltage lead of the apparatus to a fourth terminal of the utility power device, the common low voltage source outputs a common low voltage signal via the first low voltage lead to the third terminal of the utility power device, wherein the low voltage source and the common high voltage source utilizes another switching network which is separate and different from the switching network for sending the first and second high voltage signals and for receiving the respective first and second corresponding signals returned via the first lead and the second lead; and
  simultaneously measure respective fifth electrical parameters across the third terminal and the fourth terminal of the utility power device returned via the second low voltage lead of the apparatus which is connected to the fourth terminal of the utility power device.

18. The apparatus according to claim 12, wherein the electrical utility power device at least being one of: a power transformer, a current transformer, a switched capacitor bank, a circuit breaker, a recloser, a relay, a transformer bushing, a coupling capacitor or a surge arrester.

19. The apparatus according to claim 12, wherein the electrical parameters comprise one or more of: current, voltage, phase, impedance, capacitance, transformer turns ratio (TTR), reactance leakage, dielectric loss, power factor, tan delta, load burden, partial discharge or arcing.

20. The apparatus according to claim 12, wherein the corresponding first or the second return signals are selectively routed via one or more guard points of the apparatus, wherein the one or more guard points are designated as signal return nodes internal to the apparatus.

21. The apparatus according to claim 12, comprises one or more additional switching network and one or more additional leads from the apparatus to send one or more additional high voltage signals to one or more additional terminals of the utility power device, or to receive a corresponding one or more additional return signals from the electrical utility power device for measuring a corresponding one or more additional electrical parameters.

22. The method according to claim 12, wherein both the first lead and the second lead are coupled to the common high voltage source, and the apparatus simultaneously sends a high voltage signal via the first lead and the second lead to a first and a second terminal of the utility power device, and the apparatus measures the corresponding first and the second return signals received via at least or both of the first and a second low voltage leads coupled between at least one or both of the third and a fourth terminals of the utility power device.

* * * * *